US011899374B2

(12) United States Patent
Peng et al.

(10) Patent No.: US 11,899,374 B2
(45) Date of Patent: Feb. 13, 2024

(54) METHOD FOR DETERMINING AN ELECTROMAGNETIC FIELD ASSOCIATED WITH A COMPUTATIONAL LITHOGRAPHY MASK MODEL

(71) Applicant: ASML NETHERLANDS B.V., Veldhoven (NL)

(72) Inventors: Xingyue Peng, San Jose, CA (US); Jingjing Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 138 days.

(21) Appl. No.: 17/047,441

(22) PCT Filed: Apr. 16, 2019

(86) PCT No.: PCT/EP2019/059741
§ 371 (c)(1),
(2) Date: Oct. 14, 2020

(87) PCT Pub. No.: WO2019/214909
PCT Pub. Date: Nov. 14, 2019

(65) Prior Publication Data
US 2021/0116816 A1    Apr. 22, 2021

Related U.S. Application Data

(60) Provisional application No. 62/668,024, filed on May 7, 2018.

(51) Int. Cl.
*G06F 7/20*    (2006.01)
*G03F 7/00*    (2006.01)
*G06F 17/14*   (2006.01)

(52) U.S. Cl.
CPC .............. *G03F 7/705* (2013.01); *G06F 17/14* (2013.01)

(58) Field of Classification Search
CPC .................................. G03F 7/705; G06F 17/14
See application file for complete search history.

(56) References Cited

U.S. PATENT DOCUMENTS

| 5,229,872 A | 7/1993 | Mumola |
| 6,046,792 A | 4/2000 | Van Der Werf et al. |

(Continued)

FOREIGN PATENT DOCUMENTS

| CN | 102318078 | 1/2012 |
| CN | 102955370 | 3/2013 |

(Continued)

OTHER PUBLICATIONS

International Search Report and Written Opinion issued in corresponding PCT Patent Application No. PCT/EP2019/059741, dated Jul. 19, 2019.

(Continued)

*Primary Examiner* — Nha T Nguyen
(74) *Attorney, Agent, or Firm* — Pillsbury Winthrop Shaw Pittman, LLP

(57) ABSTRACT

A method for determining electromagnetic fields associated with a mask model of a patterning process. The method includes obtaining a mask stack region of interest and an interaction order corresponding to the mask stack region of interest. The mask stack region of interest is divided into sub regions. The mask stack region of interest has one or more characteristics associated with propagation of electromagnetic waves through the mask stack region of interest. The method includes generating one or more electromagnetic field determination expressions based on the Maxwell Equations and the Quantum Schrodinger Equation. The method includes determining an electromagnetic field associated with the mask stack region of interest based on the sub regions of the mask stack region of interest and the characteristics associated with the propagation of electromagnetic (Continued)

waves through the mask stack region of interest, using the one or more electromagnetic field determination expressions.

20 Claims, 14 Drawing Sheets

(56) References Cited

U.S. PATENT DOCUMENTS

| | | | |
|---|---|---|---|
| 6,670,082 B2* | 12/2003 | Liu | G03F 1/36 |
| | | | 430/5 |
| 8,938,694 B2 | 1/2015 | Liu et al. | |
| 9,835,955 B2 | 12/2017 | Liu | |
| 2004/0162692 A1 | 8/2004 | Ye et al. | |
| 2007/0011648 A1 | 1/2007 | Abrams | |
| 2007/0013887 A1 | 1/2007 | Op de Beeck | |
| 2007/0031745 A1 | 2/2007 | Ye et al. | |
| 2007/0050749 A1 | 3/2007 | Ye et al. | |
| 2007/0186206 A1* | 8/2007 | Abrams | G03F 1/36 |
| | | | 716/54 |
| 2008/0301620 A1 | 12/2008 | Ye et al. | |
| 2008/0309897 A1 | 12/2008 | Wong et al. | |
| 2009/0012769 A1* | 1/2009 | Wang | G06F 30/398 |
| | | | 703/13 |
| 2009/0157630 A1 | 6/2009 | Yuan | |
| 2009/0210851 A1 | 8/2009 | Sato | |
| 2009/0217233 A1 | 8/2009 | Mimotogi et al. | |
| 2010/0162197 A1 | 6/2010 | Ye et al. | |
| 2010/0169060 A1 | 7/2010 | Zhu | |
| 2010/0180251 A1 | 7/2010 | Ye et al. | |
| 2012/0123748 A1 | 5/2012 | Aben et al. | |
| 2013/0066597 A1 | 3/2013 | Van Beurden | |
| 2013/0073070 A1 | 3/2013 | Tsai et al. | |
| 2016/0223916 A1 | 8/2016 | Van Beurden | |
| 2018/0121586 A1 | 5/2018 | Voznesenskiy et al. | |
| 2020/0073260 A1 | 3/2020 | Cao et al. | |

FOREIGN PATENT DOCUMENTS

| | | |
|---|---|---|
| JP | 2009016424 | 1/2009 |
| TW | 201207356 | 2/2012 |
| TW | 201516391 | 5/2015 |
| WO | 2015078670 | 6/2015 |

OTHER PUBLICATIONS

Taiwanses Office Action issued in corresponding Taiwanese Patent Application No. 108115192, dated Feb. 4, 2020.
Taiwanese Office Action issued in corresponding Taiwanese Patent Application No. 108115192, dated May 29, 2020.
Zschiedrich, L. et al.: "A Rigorous Finite-Element Domain Decomposition Method for Electromagnetic Near Field Simulations," Proc. of SPIE, vol. 6924, 692450 (2008).
Xiang, C. et al.: "A New Hybrid Approach for Nanoscale Antennas in Quantum Regions," *2017 IEEE Microwaves, Radar and Remote Sensing Symposium* (*MRRS*), Kiev pp. 229-232 (2017).
Adam, K. et al.: "Simplified Models for Edge Transisitons in Rigorous Mask Modeling," Proc. of SPIE, vol. 4346 (2001).
Tirapu-Azpiroz, J. et al.: "Boundary Layer Model to Account for Thick Mask Effects in PhotoLithography," Proc. of SPIE, vol. 5040, pp. 1611-1619 (2003).
Johnson, S.G. et al.: "Adiabatic theorem and continuous coupled-mode theory for efficient taper transitions in photonic crystals," Physical Review, E 66, 066608 (2002).
Office Action issued in Chinese Patent Application No. 2019800308456 dated Nov. 23, 2022.

* cited by examiner

METHOD FOR DETERMINING AN ELECTROMAGNETIC FIELD ASSOCIATED WITH A COMPUTATIONAL LITHOGRAPHY MASK MODEL

CROSS-REFERENCE TO RELATED APPLICATIONS

This application is the U.S. national phase entry of PCT patent application no. PCT/EP2019/059741, which was filed on Apr. 16, 2019, which claims priority of U.S. patent application No. 62/668,024 which was filed on May 7, 2018, and which is incorporated herein in its entirety by reference.

TECHNICAL FIELD

The description herein relates generally to mask manufacturing and patterning processes. More particularly, the description relates to an apparatus or a method for determining electromagnetic fields associated with a mask model of a patterning process. The electromagnetic fields are determined based on the Maxwell Equations and the Quantum Schrodinger Equation.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method for determining electromagnetic fields associated with a mask model of a patterning process. The method comprises obtaining, with a hardware computer system, a mask stack region of interest and an interaction order corresponding to the mask stack region of interest. The mask stack region of interest is divided into sub regions. The mask stack region of interest has one or more characteristics associated with propagation of electromagnetic waves through the mask stack region of interest. The method comprises generating, with the hardware computer system, one or more electromagnetic field determination expressions based on the Maxwell Equations and the Quantum Schrodinger Equation. The method comprises determining, with the hardware computer system, an electromagnetic field associated with the mask stack region of interest based on the sub regions of the mask stack region of interest and the one or more characteristics associated with the propagation of electromagnetic waves through the mask stack region of interest, using the one or more electromagnetic field determination expressions.

In an embodiment, generating the one or more electromagnetic field determination expressions comprises reformulating the Maxwell Equations to correspond to the Quantum Schrodinger Equation such that a directional coordinate of a direction through the mask stack region of interest replaces a time coordinate of the Quantum Schrodinger Equation.

In an embodiment, the method further comprises determining a first characteristic of the one or more characteristics associated with propagation of electromagnetic waves through the mask stack region of interest. The first characteristic is determined based on the sub regions and/or other information. The first characteristic is associated with propagation of electromagnetic waves through the mask stack region of interest in a first direction.

In an embodiment, the first direction is the "z" direction.

In an embodiment, the first characteristic comprises film-stack configuration integrals (I) that correspond to the sub regions.

In an embodiment, the method further comprises determining a second characteristic of the one or more characteristics associated with propagation of electromagnetic waves through the mask stack region of interest. The second characteristic is determined based on the sub regions and/or other information. The second characteristic is associated with propagation of electromagnetic waves through the mask stack region of interest in second and third directions.

In an embodiment, the second direction is the "x" direction and the third direction is the "y" direction.

In an embodiment, the second characteristic comprises elemental propagation matrices (K) that correspond to the sub regions.

In an embodiment, determining the electromagnetic field associated with the mask stack region of interest comprises determining a mask Fourier Transform for the mask stack region of interest.

In an embodiment, the sub regions are slices of the mask stack region of interest.

In an embodiment the slices are formed along a "z" direction of the mask stack region of interest.

In an embodiment, determining the electromagnetic field associated with the mask stack region of interest further comprises determining propagators ($S_i$) for individual slices. In this embodiment, the propagators are determined based on the mask Fourier Transform and the one or more characteristics associated with propagation of electromagnetic waves through the mask stack region of interest.

In an embodiment, determining the electromagnetic field associated with the mask stack region of interest further comprises determining forward (P+) and backward (P−) propagation projection operators based on the propagators and/or other information.

In an embodiment, determining the electromagnetic field associated with the mask stack region of interest further comprises aggregating propagators for individual slices to determine a combined propagator (S).

In an embodiment, determining the electromagnetic field associated with the mask stack region of interest further comprises determining a multilayer propagator ($S_o$).

In an embodiment, determining the electromagnetic field associated with the mask stack region of interest further comprises determining Eigen mode projection operators (P> and P<) based on the multilayer propagator.

In an embodiment, determining the electromagnetic field associated with the mask stack region of interest further comprises using (i) the propagation projection operators and the combined propagator; or (ii) the propagation projection operators, the combined propagator, and the Eigen mode projection operators; to determine a transmission value (T) or a reflection value (R).

In an embodiment, the transmission value is determined for mask stack regions of interest associated with deep ultraviolet systems and the reflection value is determined for mask stack regions of interest associated with extreme ultraviolet systems.

In an embodiment, determining the electromagnetic field associated with the mask stack region of interest further comprises applying the transmission value or the reflection value to a modeled electromagnetic wave incident on the mask stack region of interest.

In an embodiment, the method further comprises defining, with the hardware computer system, the mask stack region of interest.

In an embodiment, the method further comprises defining, with the hardware computer system, the corresponding interaction order.

In an embodiment the method further comprises dividing, with the hardware computer system, the mask stack region of interest into sub regions.

According to another embodiment, there is provided a computer program product comprising a non-transitory computer readable medium having instructions recorded thereon, the instructions when executed by a computer implementing the method described above.

DETAILED DESCRIPTION

Figure 1:
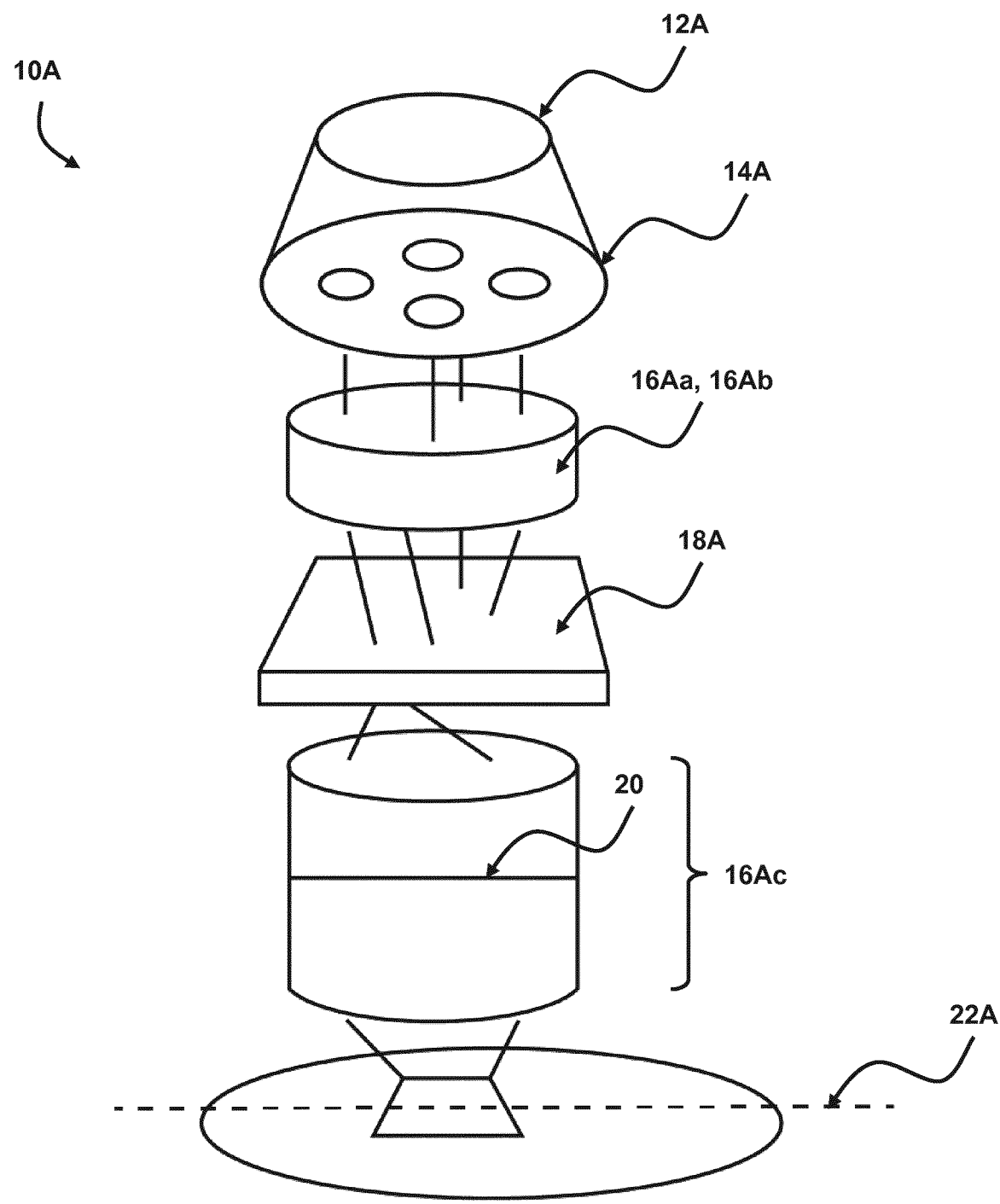
FIG. 1 shows a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

A patterning device can comprise, or can form, one or more design layouts. The design layout can be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet (DUV) excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin(Θmax), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, determination of the interaction of the radiation and the patterning device includes determining electromagnetic fields associated with a mask model of the patterning process. The described method comprises obtaining, with a hardware computer system, a mask stack region of interest and an interaction order corresponding to the mask stack region of interest. The mask stack region of interest is divided into sub regions. The mask stack region of interest has one or more characteristics associated with propagation of electromagnetic waves through the mask stack region of interest. The method comprises generating, with the hardware computer system, one or more electromagnetic field determination expressions based on the Maxwell Equations and the Quantum Schrodinger Equation. The method comprises determining, with the hardware computer system, an electromagnetic field associated with the mask stack region of interest based on the sub regions of the mask stack region of interest and the one or more characteristics associated with the propagation of electromagnetic waves through the mask stack region of interest, using the one or more electromagnetic field determination expressions. As described below, generating the one or more electromagnetic field determination expressions comprises reformulating the Maxwell Equations to correspond to the Quantum Schrodinger Equation such that a directional coordinate of a direction through the mask stack region of interest replaces a time coordinate of the Quantum Schrodinger Equation.

Three dimensional mask modeling, in general, can be divided into two categories: rigorous simulation and fast compact methods. Due to the heavy computational load for full-chip applications, rigorous simulation is not typically used in commercial computational lithography software. Fast compact methods roughly fall into two groups: Domain Decomposition Methods (DDM) and Boundary Layer Models (BLM). Neither of these two methods is image-based. As the technode shrinks below about 10 nm, three dimensional mask modeling becomes important for accurate lithographical modeling, especially for EUV systems where the thickness of mask filmstack is much larger than the imaging wavelength. Multiple internal reflection induced phase accumulation invalidates the thin mask or "linear edge superposition" approximation. Corner effects also become significant for small features, which are not typically correctly captured by edge-based methods. Current methods for image-based three dimensional mask modeling require specific mask materials and geometry calibration (e.g., edge-to-edge interactions), and have difficulty being generalized to small, non-Manhattan or gray-tone mask patterns. Often, rigorous simulation techniques such as finite difference time domain (FDTD) and rigorous coupled wave analysis (RCWA) are used. However, these are extremely computationally demanding, which makes these techniques not feasible for full-chip applications.

The method described herein effectively reformulates the Maxwell equations in the format of the Quantum Schrodinger Equation, with the z coordinate replacing the time variable t. An illumination state is represented by a 4-component vector constructed with the tangential components of the electromagnetic field. The scattering of electromagnetic waves by the three dimensional mask model translates into a state evolution problem along the z direction. Quantum perturbation theory is used to solve the equation of motion. The solution is expressed as a linear combination of the Fourier spectrum of the mask pattern, while the coefficients can be calculated without the prior knowledge of the mask patterns. The method described herein is based on the Maxwell equations, without empirical approximation, which can be naturally applied to any mask patterns without the need for geometry and/or tone classification, e.g. small corners, arbitrary-angle patterns, and gray-tone masks. The accuracy of the present method is enhanced relative to prior art systems. Using the approach described herein, the rigorous solution is explicitly obtained in the form of a series expansion, rather than implicitly indicated by a set of partial differential equations. Thus, the computational load is much less than current existing rigorous methods.

This method is more accurate than (semi-)empirical methods, and faster than existing rigorous methods. It enables simulation of arbitrary mask patterns, such as curvilinear patterns, etc. The method described herein naturally includes edge-to-edge interactions and corner effects, and is applicable to both transmissive and reflective masks of any transmission and phase. The method requires inputs of material properties (e.g., n, k), but requires no heuristic parameters. This method is scalable for full-chip models.

Figure 2:
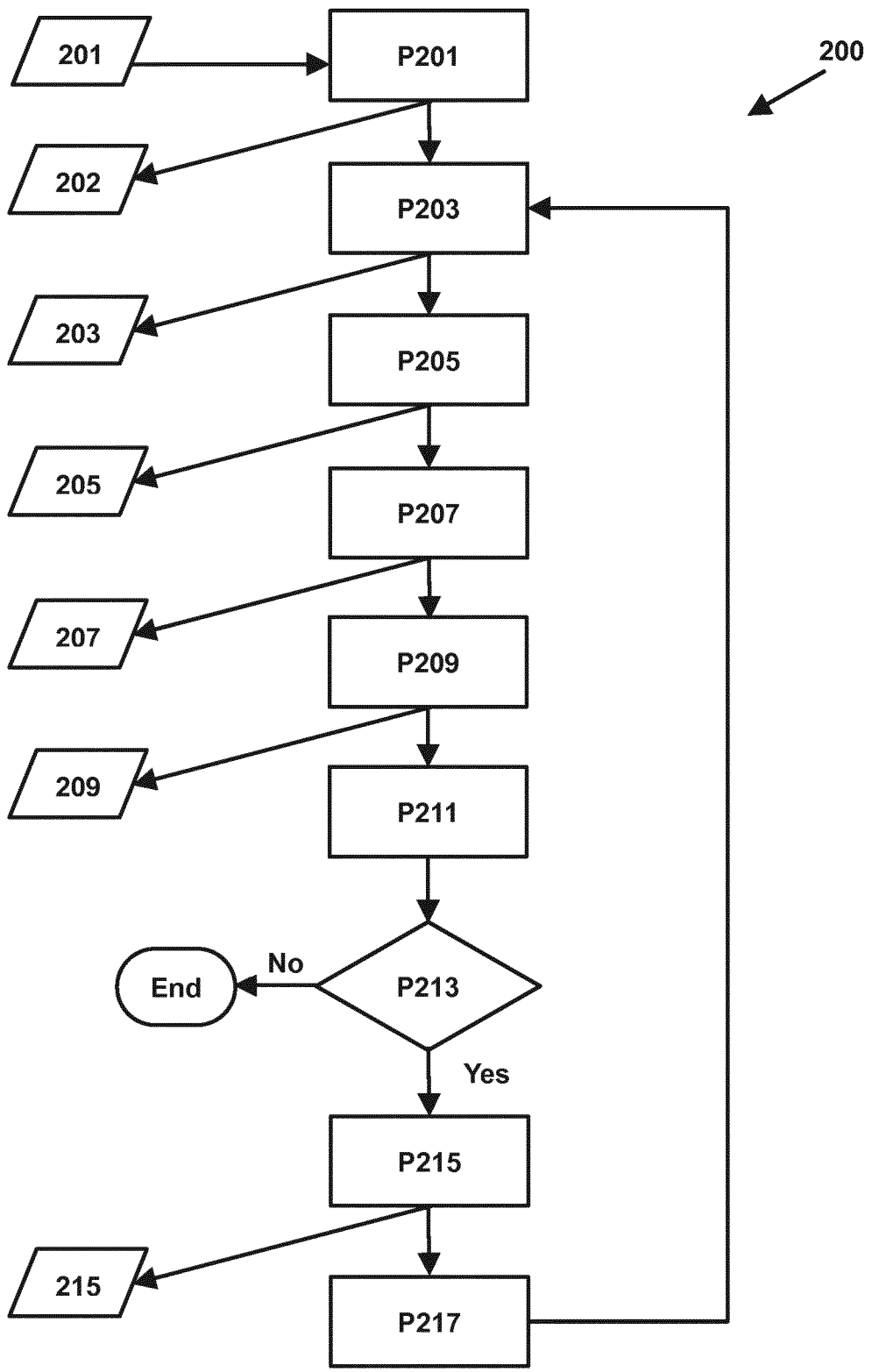
FIG. 2 is flow chart of a method for determining a patterning device pattern or a target pattern to be printed on a substrate, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate an information of mask patterns or an image (e.g., a mask variables corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a CTM+ process, where an initial image is an optimized CTM image which is further processed according to the present disclosure to generate a curvilinear mask patterns (e.g., geometry or polygonal representation shapes of a curvilinear mask or curvilinear pattern). In an embodiment, the initial image may be the enhanced image of the CTM image). The curvilinear mask patterns may be in the form of a vector, a table, mathematical equations, or other forms of representing a geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model (e.g., Tachyon model) is applied to obtain optical or resist images and cost functions are computed. The cost computation then gives the gradient values which are used in the optimization solver to update variables (e.g., pixel intensities). After several iterations during optimization, a final mask image is generated, which is further used as guidance map for pattern extraction (e.g., as implemented in Tachyon iOPC and SMO software). Such initial image (e.g., the CTM image) may include one or more features (e.g, a feature of a target pattern, SRAFs, Serifs, etc.) corresponding to the target pattern to be printed on the substrate via the patterning process.

In an embodiment, the CTM image (or an enhanced version of the CTM image) may be used to initialize the mask variables which can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location. In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image. Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203 may involve generating a mask variables 203 based on the enhanced image 202. In first iteration, the enhanced image 202 may be used to initialize the mask variables 203. In later iterations the mask variables 203 is updated iteratively.

A contour extraction of a real-valued function f of n real variables, is a set of the form:

$$L_c(f)=\{(x_1,x_2,\ldots x_n)|f(x_1,x_2,\ldots x_n)=c\}$$

In a two dimensional space, the set defines the points on the surface at which the function f equals to given value c. In a two dimensional space, the function f is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variable 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. Such modified amplitude of the signals enable generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generate tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask patterns. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern 209 that may be printed on a substrate based on the mask image 207. For example, process P209 may involve executing and/or simulating the process model using the mask image 207 as input and generating a process image 209 on the substrate (e.g., an aerial image, a resist image, etch image, etc.). In an embodiment, the process model may include a mask transmission model coupled to an optics model which is further coupled to a resist model and/or etch model. The output of the process model may be a process image 209 that has factored in different process variations during the simulation process. The process image may be further used to determine parameters (e.g., EPE, CD, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In and embodiment, process P209 and/or other processes include determining electromagnetic fields associated with a mask model of the patterning process. The process comprises defining and/or otherwise obtaining a mask stack region of interest and an interaction order corresponding to the mask stack region of interest. The mask stack region of interest is divided into sub regions. The mask stack region of interest has one or more characteristics associated with propagation of electromagnetic waves through the mask stack region of interest. The process comprises generating one or more electromagnetic field determination expressions based on the Maxwell Equations and the Quantum Schrodinger Equation. In an embodiment, generating the one or more electromagnetic field determination expressions comprises reformulating the Maxwell Equations to correspond to the Quantum Schrodinger Equation such that a directional coordinate of a direction through the mask stack region of interest replaces a time coordinate of the Quantum Schrodinger Equation. The process comprises determining an electromagnetic field associated with the mask stack region of interest based on the sub regions of the mask stack region of interest and the one or more characteristics associated with the propagation of electromagnetic waves through the mask stack region of interest, using the one or more electromagnetic field determination expressions. This is illustrated FIGS. 3-9 and further described below. During the discussion of these figures, references to various equations are made. A description of these equations is included the Mathematical Examples section included below.

Figure 3:
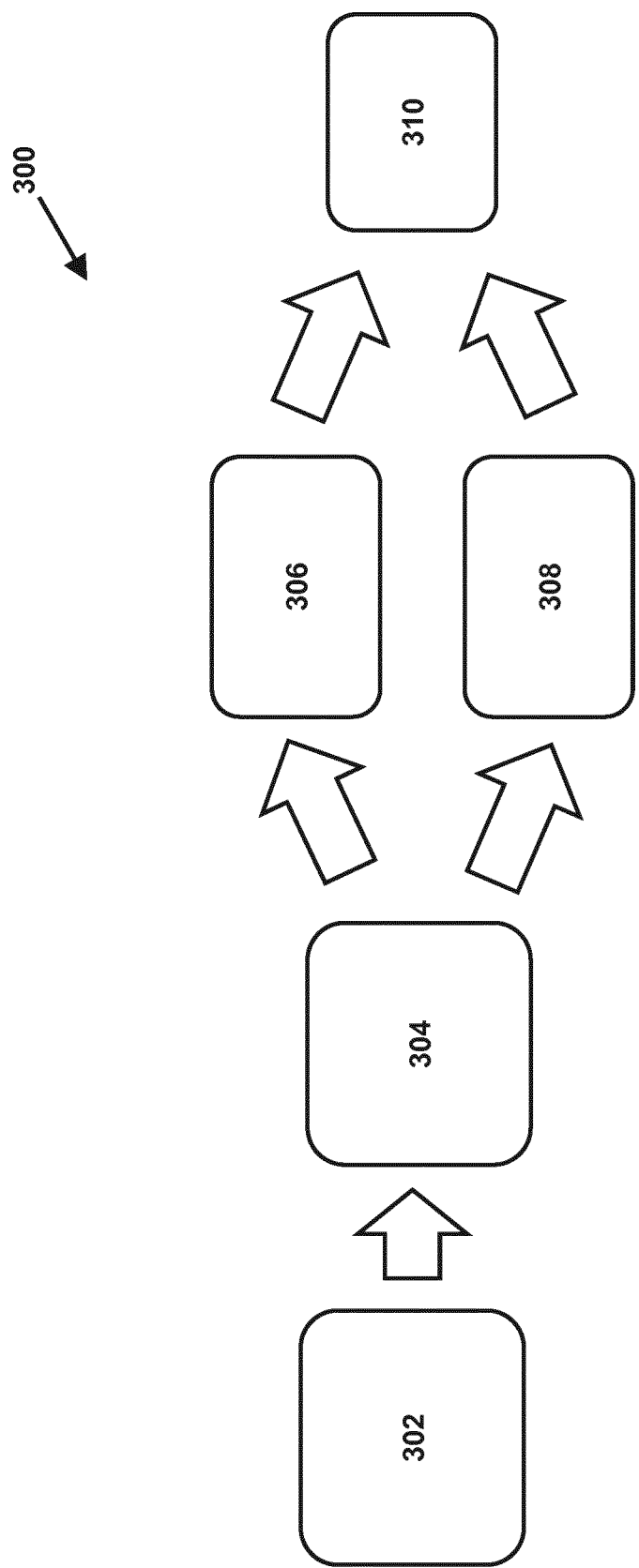
FIG. 3 illustrates a first set of operations for determining electromagnetic fields associated with a mask model of the patterning process, according to an embodiment.

For example, FIG. 3 illustrates a first set 300 of operations including defining or otherwise obtaining 302 a mask stack region of interest and an interaction order, dividing 304 the mask stack into slices, calculating 306 filmstack configuration integrals (I), calculating 308 elemental propagation matrices (K), and saving 310 the filmstack configuration integrals and the elemental propagation matrices in and/or as an M3D library.

In an embodiment, a mask stack region of interest may be a target area of a photolithography mask model. The model and/or mask stack region of interest may include one or more layers, one or more materials, one or more apertures, and/or other features. In an embodiment, one or more material properties may be associated with one of more of the layers. For example, the mask stack region of interest may include a quartz layer and a MoSi layer with an aperture therethrough. Individual layers may have parameters such as n (which may be the real part of the refractive index of materials of mask stack layers), k (which may be the imaginary part of the refractive index of materials of mask stack layers), or other parameters associated with the material of a layer. This example is not intended to be limiting.

The interaction order may be related to or indicative of scattering of a model of an electromagnetic wave as it passes through the model of the mask stack region of interest. In an embodiment, the interaction may be a summation or other aggregation of contributions from various orders (e.g., 0, 1, 2, 3, . . . ). For example, an interaction order of zero may indicate no interaction between an electromagnetic (e.g., a light) wave and a mask. An interaction order of one may indicate free propagation of the electromagnetic wave to a specific plane where the electromagnetic wave is scattered, then free propagation through the rest of the filmstack. There may be infinite possible interaction orders. However, if the mask stack region of interest is sufficiently thin (signifi-cantly less than the wavelength divided by ($\varepsilon_r$−1), where $\varepsilon_r$ is the dielectric constant), the phase distortion induced by the medium is small and an interaction order of one may be sufficient for an accurate model. For example, the interaction order is represented by the "n" in the equation below (Equation 103 in the Mathematical Examples section).

$$\langle k_x', k_y' | \hat{S}(z, 0) | k_x, k_y \rangle = \sum_{n=0}^{\infty} \sum_{[k' \ldots k]_{n+1}} c \ldots c_{[k' \ldots k]_{n+1}}$$

$$\sum_{[bF]_{n+1}} \sum_{[bG]_n} I_{[bF]_{n+1}}^{[BG]_n}([k' \ldots k]_{n+1}, z, 0) K_{[bF]_{n+1}}^{[bG]_n}([k' \ldots k]_{n+1})$$

In an embodiment, defining and/or otherwise obtaining 302 the mask stack region of interest and an interaction order corresponding to the mask stack region of interest may include defining the mask stack region of interest and/or the interaction order using one or more computing resources included in the present system. In an embodiment, defining and/or otherwise obtaining 302 the mask stack region of interest and an interaction order corresponding to the mask stack region of interest may include obtaining the mask stack region of interest and/or the interaction order using one or more computing resources included in the present system from one or more other computing systems and/or databases included in the present system, from one or more other computing systems and/or databases associated with the present system, and/or from one or more other computing systems and/or databases external to the present system. In an embodiment, defining and/or otherwise obtaining 302 the mask stack region of interest and an interaction order corresponding to the mask stack region of interest may include obtaining information related to the mask stack region of interest and/or the interaction order and defining the mask stack region of interest and/or the interaction order based on the obtained information using one or more computing resources included in the present system.

As described above, the mask stack region of interest is divided into sub regions. In an embodiment, the mask stack region of interest is divided 304 into slices as shown in FIG. 3. In an embodiment, the slices are formed along a "z" direction of the mask stack region of interest.

The mask stack region of interest has one or more characteristics associated with propagation of electromagnetic waves through the mask stack region of interest. In an embodiment, operations 300 include determining 306 a first characteristic of the one or more characteristics associated with propagation of electromagnetic waves through the mask stack region of interest. The first characteristic may be determined based on the sub regions and/or other information. In an embodiment, the first characteristic is associated with propagation of electromagnetic waves through the mask stack region of interest in a first direction. In an embodiment, the first direction is the "z" direction. In an embodiment, the first characteristic comprises the filmstack configuration integrals (I). In an embodiment, the filmstack configuration integrals correspond to the slices and/or other sub regions. The filmstack configuration integrals are constructed based upon the dielectric property distribution along the z direction (the items h(z) and l(z) in the integral equations below can be expressed by the refractive index of the film stack), and capture the accumulated scattering effect of the filmstack configuration upon the EM wave. In an embodiment, the filmstack configuration integrals may be determined using and/or based on the equations below (Equations 105-111 in the Mathematical Examples section).

$$I^{01}_{011}([k', k_1, k], z, 0) = (ik_0)^2 \int_0^z dz'$$

$$\int_0^{z'} dz'' \cos[k_z(k') \cdot (z-z')] h(z') \cdot \frac{ik_0 \sin[k_z(k_1) \cdot (z'-z'')]}{k_z(k_1)} l(z'') \frac{ik_0 \sin k_z(k) z''}{k_z(k)}$$

$$I^{[0...]_n}_{[0...]_{n+1}}([k \ ...]_{n+1}, z, 0) =$$

$$ik_0 \int_0^z \cos[k_z(k)(z-z')] h(z') I^{[...]_{n-1}}_{[...]_n}([...]_n, z', 0) dz'$$

$$I^{[0...]_n}_{[1...]_{n+1}}([k \ ...]_{n+1}, z, 0) =$$

$$ik_0 \int_0^z \frac{ik_0 \sin[k_z(k)(z-z')]}{k_z(k)} h(z') I^{[...]_{n-1}}_{[...]_n}([...]_n, z', 0) dz'$$

$$I^{[1...]_n}_{[0...]_{n+1}}([k \ ...]_{n+1}, z, 0) =$$

$$ik_0 \int_0^z \cos[k_z(k)(z-z')] l(z') I^{[...]_{n-1}}_{[...]_n}([...]_n, z', 0) dz'$$

$$I^{[1...]_n}_{[1...]_{n+1}}([k \ ...]_{n+1}, z, 0) =$$

$$ik_0 \int_0^z \frac{ik_0 \sin[k_z(k)(z-z')]}{k_z(k)} l(z') I^{[...]_{n-1}}_{[...]_n}([...]_n, z', 0) dz'$$

$$I^{[\ ]}_{[0]}([k], z, 0) = \cos[k_z(k)(z-0)]$$

$$I^{[\ ]}_{[0]}([k], z, 0) = \frac{ik_0 \sin[k_z(k)(z-0)]}{k_z(k)}$$

In an embodiment, operations 300 include determining 308 a second characteristic of the one or more characteristics associated with propagation of electromagnetic waves through the mask stack region of interest. The second characteristic is determined based on the sub regions and/or other information. The second characteristic may associated with propagation of electromagnetic waves through the mask stack region of interest in second and third directions. In an embodiment, the second direction is the "x" direction and the third direction is the "y" direction. In an embodiment, the second characteristic comprises elemental propagation matrices (K) that correspond to the sub regions. The elemental propagation matrices characterize how an elemental structure of the mask pattern (in x and y directions) changes the relative phase between the electric and magnetic field components, as the EM wave travels through the z direction by a distance with a unit interaction strength. In an embodiment, the elemental propagation matrices may be determined using and/or based on the equations below (Equations 112-116 in the Mathematical Examples section).

$$K^{[0\ ...\ ]_{n+1}}_{K^{[\ ...\ ]_n}}{}^{[0\ ...\ ]_n([kk_1\ ...\ ]_{n+1})=g(k;k_1)}_{[\ ...\ ]_{n-1}([k_1\ ...\ ]_n)}$$

$$K^{[1\ ...\ ]_{n+1}}_{K^{[\ ...\ ]_n}}{}^{[0\ ...\ ]_n([kk_1\ ...\ ]_{n+1})=F(k)g(k;k_1)}_{[\ ...\ ]_{n-1}([k_1\ ...\ ]_n)}$$

$$K^{[0\ ...\ ]_{n+1}}_{K^{[\ ...\ ]_n}}{}^{[1\ ...\ ]_n([kk_1\ ...\ ]_{n+1})=g_c}_{[\ ...\ ]_{n-1}([k_1\ ...\ ]_n)}$$

$$K^{[1\ ...\ ]_{n+1}}_{K^{[\ ...\ ]_n}}{}^{[1\ ...\ ]_n([kk_1\ ...\ ]_{n+1})=F(k)g_c}_{[\ ...\ ]_{n-1}([k_1\ ...\ ]_n)}$$

In an embodiment, saving the filmstack configuration integrals and/or the elemental propagation matrices in and/or as an M3D library includes electronically storing the filmstack configuration integrals and/or the elemental propagation matrices in electronic storage included in and/or accessed by one or more computing components of the present system. The stored M3D library may be accessed one or more times as described herein to facilitate determination of the electromagnetic fields and/or for other purposes.

Figure 4:
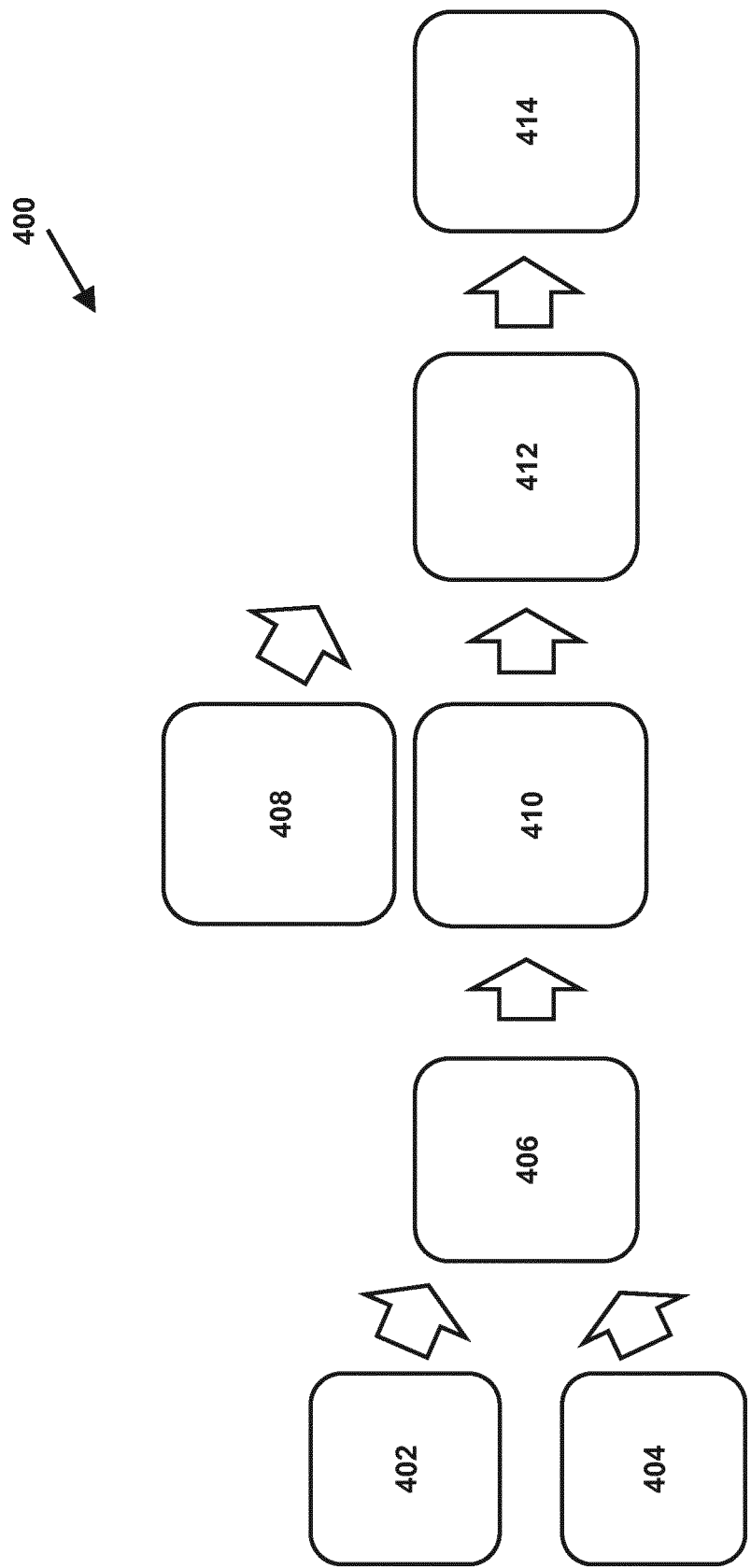
FIG. 4 illustrates a second set of operations for determining electromagnetic fields associated with a mask model of the patterning process that occur subsequent to the operations illustrated in FIG. 3, according to an embodiment.
Figure 5:
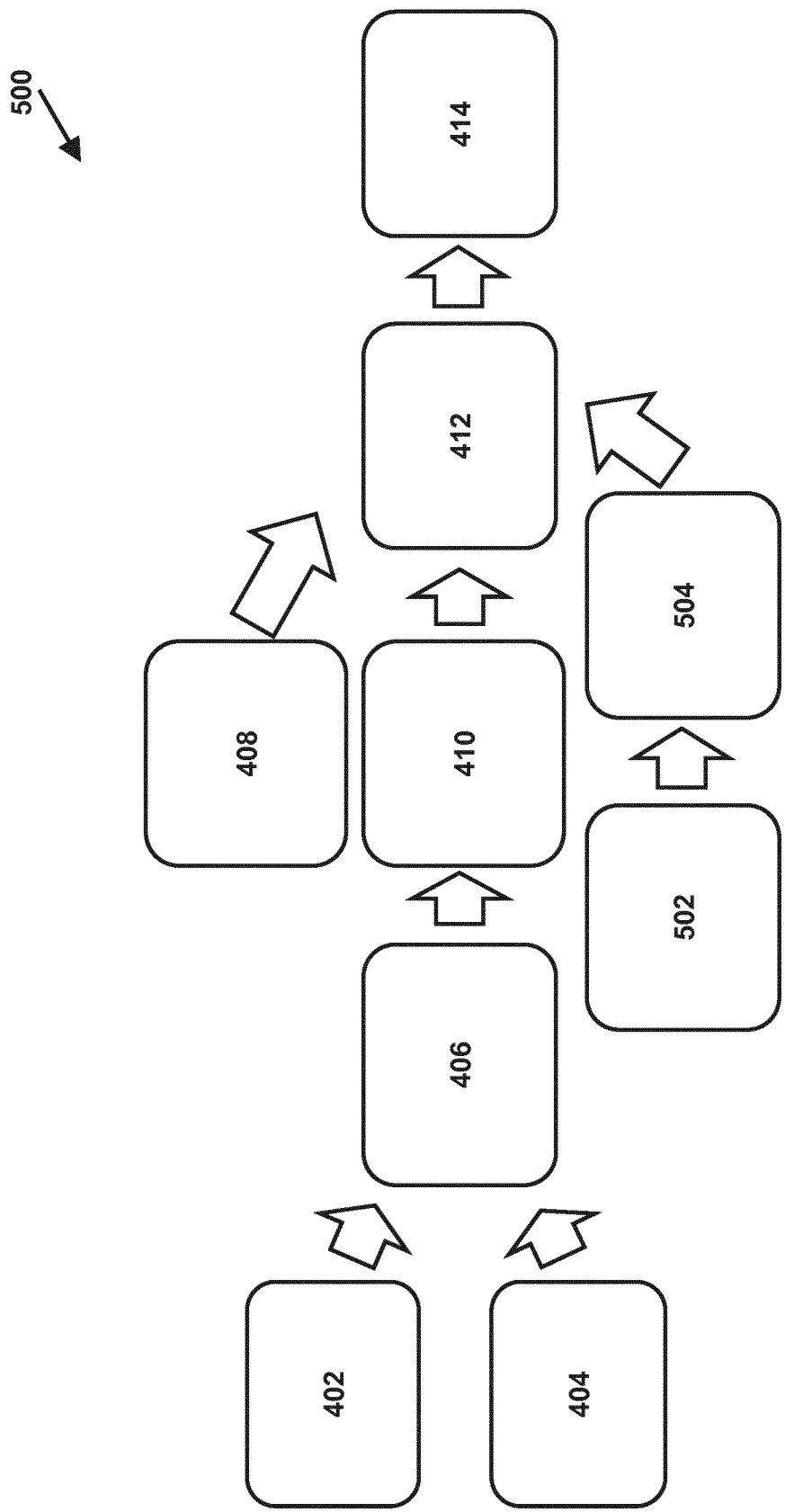
FIG. 5 illustrates an alternative second set of operations for determining electromagnetic fields associated with a mask model of the patterning process that occur subsequent to the operations illustrated in FIG. 3, according to an embodiment.

FIG. 4 and FIG. 5 illustrate alternative second sets 400 and 500 of operations for determining electromagnetic (EM) fields associated with a mask model of the patterning process. The operations illustrated in either FIG. 4 or FIG. 5 occur subsequent to the operations illustrated in FIG. 3. The operations illustrated in FIG. 4 include obtaining 402 the filmstack configuration integrals (I) and the elemental propagation matrices (K) from the M3D library, calculating 404 a mask Fourier Transform, determining 406 a propagator for individual slices or other sub regions (Si), determining 408 forward (P+) and backward (P−) propagation projection operators, determining 410 a total propagator (S), combining the forward and backward propagation operators with the total propagator to determine 412 a total transmission (T) for DUV applications, or reflection (R) for EUV applications, and applying 414 the transmission or reflection on an incident wave to determine an output electromagnetic field. The operations illustrated in FIG. 5 include the operations of FIG. 4, calculating 502 a multilayer propagator ($S_0$), and calculating 504 Eigen mode projection operators ($P^>$ and $P^<$).

In an embodiment, obtaining 402 the filmstack configuration integrals and the elemental propagation matrices from the M3D library includes electronically obtaining the filmstack configuration integrals and/or the elemental propagation matrices from electronic storage included in and/or accessed by one or more computing components of the present system. The stored M3D library may be accessed one or more times as described herein to facilitate determination of the electromagnetic fields and/or for other purposes.

As described above, determining the electromagnetic field associated with the mask stack region of interest comprises calculating and/or otherwise determining 404 a mask Fourier Transform for the mask stack region of interest. Calculating and/or otherwise determining 404 a mask Fourier Transform for the mask stack region of interest may include generating a two-dimensional function that represents the mask stack region of interest in an x-y plane. In an embodiment, calculating and/or otherwise determining 404 the mask Fourier Transform for the mask stack $$m(x, y) = \sum_{\alpha\beta} c_{\alpha\beta} e^{i(\alpha x + \beta y)}$$

region of interest comprises representing electromagnetic wave absorbing portions of the mask with a numerical 1, and representing non-absorbing portions of the mask in the x-y plane with a numerical 0. In an embodiment, the Fourier Transform for the mask stack region of interest may be determined using and/or based on the equation below (Equation 94 in the Mathematical Examples section).

Determining the electromagnetic field associated with the mask stack region of interest comprises calculating and/or otherwise determining 406 propagators (Si) for individual slices. In this embodiment, the propagators are determined based on the mask Fourier Transform and the one or more characteristics (e.g., the filmstack configuration integrals and/or the elemental propagation matrices) associated with propagation of electromagnetic waves through the mask stack region of interest. In an embodiment, a propagator may be a connection between two field distributions. For example, to describe an arbitrary slice of the mask stack region of interest, given an input field (e.g., a function), a propagator (e.g., an operator) may be used to generate an output field (e.g., function). In an embodiment, the propagators may be determined using and/or based on the equation below (Equation 103 in the Mathematical Examples section).

$$\langle k'_x, k'_y | \hat{S}(z, 0) | k_x, k_y \rangle = \sum_{n=0}^{\infty} \sum_{[k' \ldots k]_{n+1}} c \ldots c_{[k' \ldots k]_{n+1}}$$

$$\sum_{[bF]_{n+1}} \sum_{[bG]_n} I_{[bF]_{n+1}}^{[bG]_n}([k' \ldots k]_{n+1}, z, 0) K_{[bF]_{n+1}}^{[bG]_n}([k' \ldots k]_{n+1})$$

Determining the electromagnetic field associated with the mask stack region of interest further comprises calculating and/or otherwise determining 408 forward ($P^+$) and backward ($P^-$) propagation projection operators based on the propagators and/or other information. For example, a given input field (e.g., function) may be split into different parts (e.g., like a vector). Here, the input field may be projected into a forward propagating component and a backward propagating component. In an embodiment, the forward and backward projection operators may be determined using and/or based on the equations below (Equations 126-129 in the Mathematical Examples section).

In an embodiment, as shown in FIG. 5, determining the electromagnetic field associated with the mask stack region of interest further comprises calculating and/or otherwise determining 502 a multilayer propagator ($S_0$). The multilayer propagator is the propagator of a unit cell of a multilayer reflector, which captures the reflective properties of the latter. $S_0$ can be calculated following the same procedure as S. Being free of patterns makes the calculation of $S_0$ relatively easier than S.

In an embodiment, as shown in FIG. 5, determining the electromagnetic field associated with the mask stack region of interest further comprises calculating and/or otherwise determining 504 Eigen mode projection operators (P> and P<) based on the multilayer propagator. In an embodiment, the Eigen mode projection operators may be determined using and/or based on the equations below (Equations 131-132 in the Mathematical Examples section).

$$\langle k'_x, k'_y | \hat{P}^< | k_x, k_y \rangle = \delta(k_x - k'_x) \delta(k_y - k'_y) \sum_{\|e_i\| < 1} |v_i\rangle\langle v_i|$$

$$\langle k'_x, k'_y | \hat{P}^> | k_x, k_y \rangle = \delta(k_x - k'_x) \delta(k_y - k'_y) \sum_{\|e_i\| \geq 1} |v_i\rangle\langle v_i|$$

As shown in FIG. 4 and FIG. 5, determining the electromagnetic field associated with the mask stack region of $$\langle k'_x, k'_y | \hat{P}^+ | k_x, k_y \rangle = \delta(k_x - k'_x) \delta(k_y - k'_y)(|s+\rangle\langle s+| + |p+\rangle\langle p+|) = \delta(k_x - k'_x) \delta(k_y - k'_y) \cdot$$

$$\frac{1}{2} \begin{pmatrix} 1 & 0 & \frac{k_x k_y}{k_0 \sqrt{k_0^2 - k_x^2 - k_y^2}} & \frac{k_0^2 - k_x^2}{k_0 \sqrt{k_0^2 - k_x^2 - k_y^2}} \\ 0 & 1 & -\frac{k_0^2 - k_y^2}{k_0 \sqrt{k_0^2 - k_x^2 - k_y^2}} & -\frac{k_x k_y}{k_0 \sqrt{k_0^2 - k_x^2 - k_y^2}} \\ -\frac{k_x k_y}{k_0 \sqrt{k_0^2 - k_x^2 - k_y^2}} & -\frac{k_0^2 - k_x^2}{k_0 \sqrt{k_0^2 - k_x^2 - k_y^2}} & 1 & 0 \\ \frac{k_0^2 - k_y^2}{k_0 \sqrt{k_0^2 - k_x^2 - k_y^2}} & \frac{k_x k_y}{k_0 \sqrt{k_0^2 - k_x^2 - k_y^2}} & 0 & 1 \end{pmatrix}$$

$$\langle k'_x, k'_y | \hat{P}^- | k_x, k_y \rangle = \delta(k_x - k'_x) \delta(k_y - k'_y)(|s-\rangle\langle s-| + |p-\rangle\langle p-|) = \delta(k_x - k'_x) \delta(k_y - k'_y) \cdot$$

$$\frac{1}{2} \begin{pmatrix} 1 & 0 & -\frac{k_x k_y}{k_0 \sqrt{k_0^2 - k_x^2 - k_y^2}} & -\frac{k_0^2 - k_x^2}{k_0 \sqrt{k_0^2 - k_x^2 - k_y^2}} \\ 0 & 1 & \frac{k_0^2 - k_y^2}{k_0 \sqrt{k_0^2 - k_x^2 - k_y^2}} & \frac{k_x k_y}{k_0 \sqrt{k_0^2 - k_x^2 - k_y^2}} \\ \frac{k_x k_y}{k_0 \sqrt{k_0^2 - k_x^2 - k_y^2}} & \frac{k_0^2 - k_x^2}{k_0 \sqrt{k_0^2 - k_x^2 - k_y^2}} & 1 & 0 \\ -\frac{k_0^2 - k_y^2}{k_0 \sqrt{k_0^2 - k_x^2 - k_y^2}} & -\frac{k_x k_y}{k_0 \sqrt{k_0^2 - k_x^2 - k_y^2}} & 0 & 1 \end{pmatrix}$$

Determining the electromagnetic field associated with the mask stack region of interest further comprises aggregating and/or otherwise combining 410 propagators for individual slices to determine a total and/or a combined propagator (S). The total and/or combined propagator may be thought of a connection n between an initial input field distribution and a final field distribution. In an embodiment, the total and/or combined propagator may be determined using and/or based on the equation below (Equation 65 in the Mathematical Examples section).

$$\hat{S}(z_3, z_0) = \hat{S}(z_3, z_2) \hat{S}(z_2, z_1) \hat{S}(z_1, z_0)$$

interest comprises using (i) the propagation projection operators and the combined propagator; or (ii) the propagation projection operators, the combined propagator, and the Eigen mode projection operators; to calculate and/or otherwise determine 412 the transmission value (T) or a reflection value (R). In an embodiment, the transmission value is determined for mask stack regions of interest associated with deep ultraviolet (DUV) systems and the reflection value is determined for mask stack regions of interest associated with extreme ultraviolet (EUV) systems. In an embodiment, the T and/or R may be determined using and/or based on the equations below (Equations 69 and 74 in the Mathematical Examples section).

$$\hat{T} = \hat{P}^+ \hat{S}(1 - \hat{P}^+ \hat{S}^{-1} \hat{P}^- \hat{S})^{-1}$$

$$\hat{R} = -\hat{P}_- \hat{S}^{-1} \hat{P}^> \hat{S}(1 - \hat{P}_+ \hat{S}^{-1} \hat{P}^> \hat{S})^{-1}$$

Determining the electromagnetic field associated with the mask stack region of interest further comprises applying 414 the transmission value or the reflection value to a modeled electromagnetic wave incident on the mask stack region of interest. In an embodiment, T and R are operators (e.g., they are connections between two functions). Using T or R, the system may determine an output field for any input field.

Figure 6:
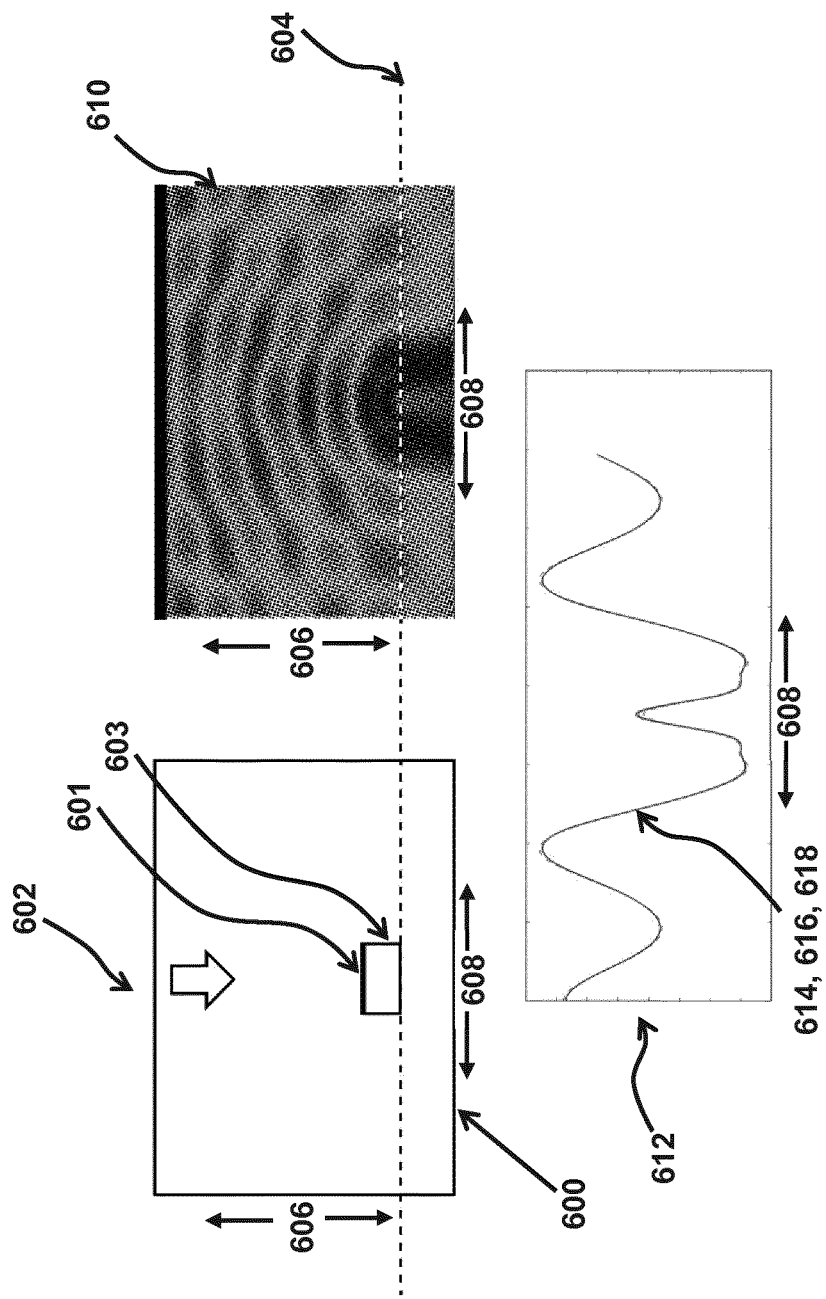
FIG. 6 illustrates a first example output from the application of a transmission value or a reflection value determined as described herein to a modeled electromagnetic wave incident on a first example mask stack region of interest, according to an embodiment.

FIG. 6-9 illustrate example outputs from the application of the transmission value or the reflection value determined as described above to a modeled electromagnetic wave incident on various mask stack regions of interest. These outputs are compared to corresponding output from rigorous simulation techniques such as finite difference time domain (FDTD) in each figure. For example, FIG. 6 illustrates an example mask stack region of interest 600 (e.g., comprising a quartz layer 601 and a MoSi layer 603), an incident electromagnetic wave 602 positioned directly above (in the "z" direction 606 on an example "z"-"y" 608 plane) mask stack region of interest 600, and a sample plane 604. FIG. 6 also includes an illustration 610 of modeled near field intensity on the "z" 606-"y" 608 plane, and modeled near field intensity 612 at sample plane 604. Near field intensity 612 includes three different modeled near field intensities 614, 616, and 618. Modeled near field intensity 614 was determined using the rigorous FDTD simulation technique. Modeled near field intensity 614 may be thought of as a reference, for example. Modeled near field intensity 616 was determined using the operations described herein with interaction orders up to 2. Modeled near field intensity 618 was determined using the operations described herein with interaction orders up to 1. As shown in FIG. 6, modeled near field intensities 614, 616, and 618 are highly correlated (e.g., all three lines in the graph lie nearly on top of each other). This shows that the method described herein produces results comparable (e.g., with accuracy similar) to a rigorous simulation. However, as described above, the operations described herein used to determine modeled near field intensities 616 and 618 require a computational load that is much less than the computational load required for current existing rigorous methods. The operations described herein may also be performed much faster than a typical rigorous simulation (e.g., M3DLib Gen: 356s vs. M3D Apply: 1.52s).

Figure 7:
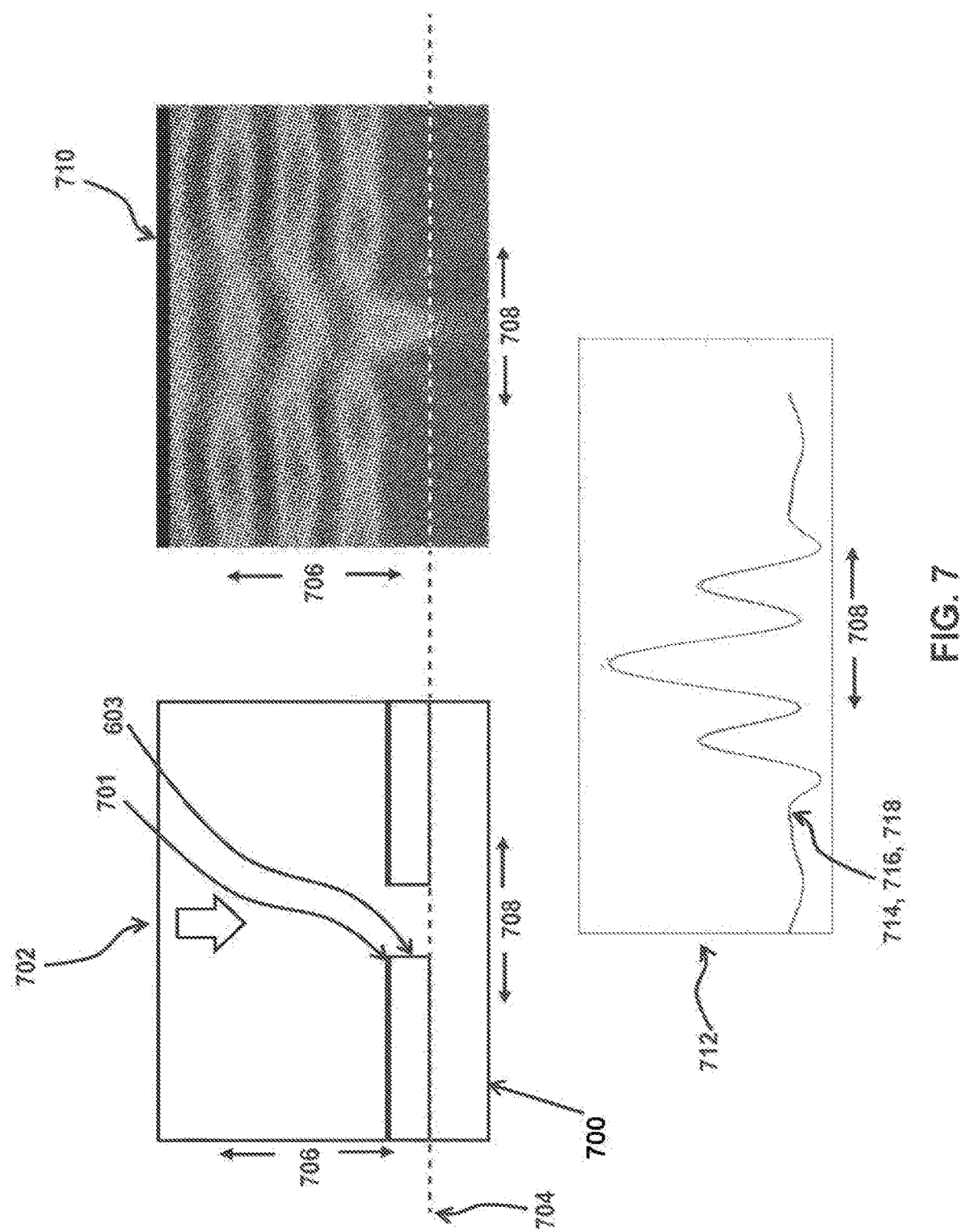
FIG. 7 illustrates a second example output from the application of a transmission value or a reflection value determined as described herein to a modeled electromagnetic wave incident on a second example mask stack region of interest, according to an embodiment.

FIG. 7 illustrates a second example mask stack region of interest 700 (e.g., comprising a quartz layer 701 and a MoSi layer 703 with an aperture), an incident electromagnetic wave 702 positioned directly above (in the "z" direction 706 on an example "z"-"y" 708 plane) the aperture in mask stack region of interest 700, and a sample plane 704. FIG. 7 also includes an illustration 710 of modeled near field intensity on the "z" 706-"y" 708 plane, and modeled near field intensity 712 at sample plane 704. Near field intensity 712 includes three different modeled near field intensities 714, 716, and 718. Modeled near field intensity 714 was determined using the rigorous FDTD simulation technique. Modeled near field intensity 716 was determined using the operations described herein with interaction orders up to 2. Modeled near field intensity 718 was determined using the operations described herein with interaction orders up to 1. Similar to modeled near field intensities 614, 616, and 618 shown in FIG. 6, modeled near field intensities 714, 716, and 718 are again highly correlated. All three lines in the graph are nearly indistinguishable from each other. Modeled near field intensities 716 and 718 were also produced much faster than modeled near field intensity 714 (e.g., M3DLib Gen: 344s vs. M3D Apply: 1.31s).

Figure 8:
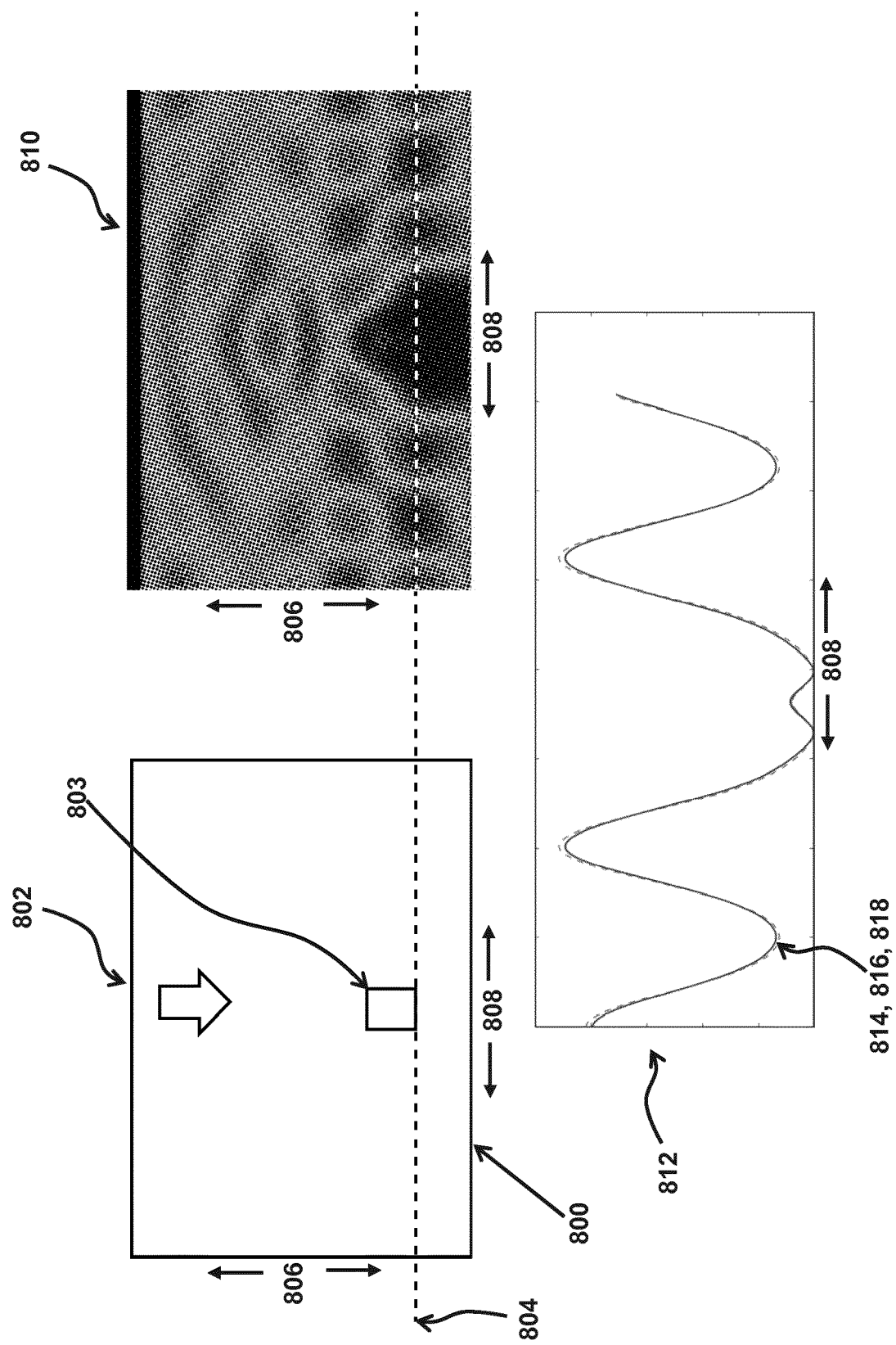
FIG. 8 illustrates a third example output from the application of a transmission value or a reflection value determined as described herein to a modeled electromagnetic wave incident on a third example mask stack region of interest, according to an embodiment.

FIG. 8 illustrates a third example mask stack region of interest 800 (e.g., comprising a MoSi layer 803), an incident electromagnetic wave 802 positioned directly above (in the "z" direction 806 on an example "z"-"y" 808 plane) mask stack region of interest 800, and a sample plane 804. FIG. 8 also includes an illustration 810 of modeled near field intensity on the "z" 806-"y" 808 plane, and modeled near field intensity 812 at sample plane 804. Near field intensity 812 includes three different modeled near field intensities 814, 816, and 818. Modeled near field intensity 814 was determined using the rigorous FDTD simulation technique. Modeled near field intensity 816 was determined using the operations described herein with interaction orders up to 2. Modeled near field intensity 818 was determined using the operations described herein with interaction orders up to 1. Similar to modeled near field intensities shown in FIG. 6 and FIG. 7, modeled near field intensities 814, 816, and 818 are again highly correlated. All three lines in the graph are nearly indistinguishable from each other. Modeled near field intensities 816 and 818 were also produced much faster than modeled near field intensity 814 (e.g., M3DLib Gen: 183s vs. M3D Apply: 0.76s).

Figure 9:
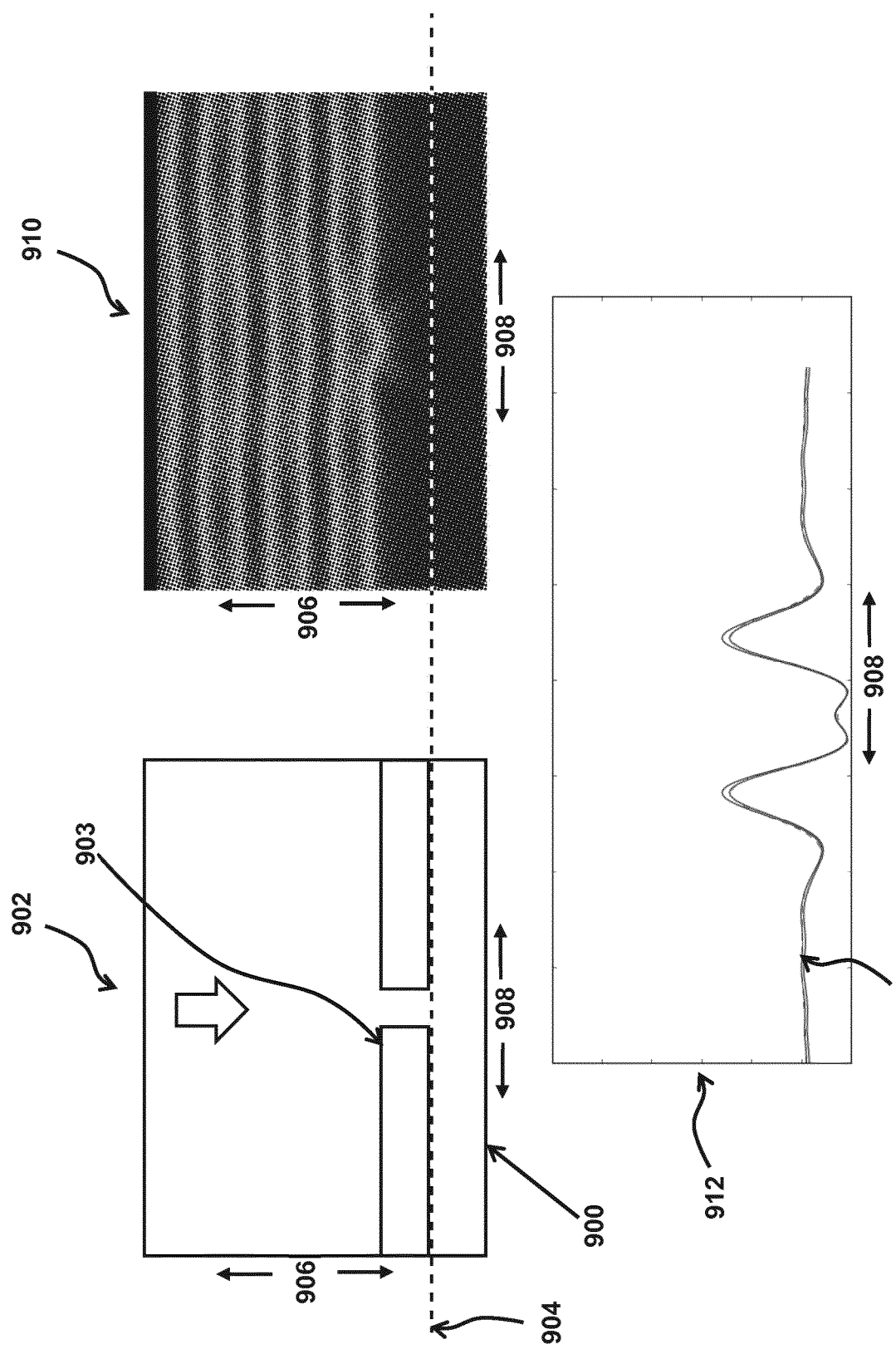
FIG. 9 illustrates a fourth example output from the application of a transmission value or a reflection value determined as described herein to a modeled electromagnetic wave incident on a fourth example mask stack region of interest, according to an embodiment.

FIG. 9 illustrates a fourth example mask stack region of interest 900 (e.g., comprising a MoSi layer 903 with an aperture), an incident electromagnetic wave 902 positioned directly above (in the "z" direction 906 on an example "z"-"y" 908 plane) the aperture in mask stack region of interest 900, and a sample plane 904. FIG. 9 also includes an illustration 910 of modeled near field intensity on the "z" 906-"y" 908 plane, and modeled near field intensity 912 at sample plane 904. Near field intensity 912 includes three different modeled near field intensities 914, 916, and 918. Modeled near field intensity 914 was determined using the rigorous FDTD simulation technique. Modeled near field intensity 916 was determined using the operations described herein with interaction orders up to 2. Modeled near field intensity 918 was determined using the operations described herein with interaction orders up to 1. Similar to modeled near field intensities shown in FIGS. 6-8, modeled near field intensities 914, 916, and 918 are again highly correlated. All three lines in the graph are nearly indistinguishable from each other. Modeled near field intensities 916 and 918 were also produced much faster than modeled near field intensity 914 (e.g., M3DLib Gen: 174s vs. M3D Apply: 0.65s).

Returning to FIG. 2, in process P211, a cost function may be evaluated based on the process model image 209 (also referred as a simulated substrate image or substrate image or wafer image). Thus, the cost function may be considered as process aware, where variations of the patterning process, enabling generation of a curvilinear mask patterns that accounts for variations in patterning process. For example, the cost function may be an edge placement error (EPE), sidelobe, a mean squared error (MSE) or other appropriate variable defined based on the contour of the patterns in the process image. An EPE may be an edge placement error associated with one or more patterns and/or a summation of all the edge placement errors related to all the patterns of the process model image 209 and the corresponding target patterns. In an embodiment, the cost function may include more than one conditions that may be simultaneously reduced or minimized. For example, in addition to the MRC violation probability, the number of defects, EPE, overlay, CD or other parameter may be included and all the conditions may be simultaneously reduced (or minimized).

Furthermore, one or more gradient maps (discussed later) may be generated based on the cost function (e.g., EPE) and mask variables may be modified based on such gradient map(s). Mask variables (MV) refer to intensities of Ø. Accordingly, the gradient computation may be represented as dEPE/dØ, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed and a corresponding mask may be fabricated not only based on forward simulation of the patterning process, but also additionally based on manufacturing limitations of the mask manufacturing apparatus/process. Thus, a manufacturable curvilinear mask producing high yield (i.e., minimum defects) and high accuracy in terms of, for example, EPE or overlay on the printed pattern may be obtained.

The pattern corresponding to a process image should be exactly same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modifying the mask variables 203

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of CTM+ results (i.e., a modified version of the enhanced image, mask image, or curvilinear mask).

In an embodiment of the present disclosure, the transition from CTM optimization with grayscale image to CTM+ optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final CTM+ image may be achieved allowing improved results in the final CTM+ optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

The present method has several features or aspects. For example, using an optimized CTM mask image with image enhancement methods to improve the signal which may be further used as seeding in an optimization flow. In another aspect, use of the thresholding method with the CTM technique (referred to as CTM+) enables generation of curvilinear mask patterns. In yet another aspect, a full formulation (i.e., a closed loop formulation) of gradient computation also allows using a gradient based solver for mask variable optimization. The CTM+ results may be used as a local solution (as hotspot repair) or used as a full chip solution. The CTM+ results may be used together with machine learning as input. This may allow the use of machine learning to speed up CTM+. In yet another aspect, the method includes image regularization methods to improve the results. In another aspect, the method involves successive optimization stages to achieve more smooth transitions from grayscale image CTM to binary curvilinear mask CTM+. The method allows tuning the threshold of optimization to improve results. The method includes additional transformation into an iteration of optimization to enforce good property of results (require smoothness in CTM+ image).

As lithography node keeps shrinking, more and more complicated masks are required. The present method may be used in key layers with DUV scanners, EUV scanners, and/or other scanners. The method according to the present disclosure may be included in different aspect of the mask optimization process including source mask optimization, mask optimization, and/or OPC.

Figure 10:
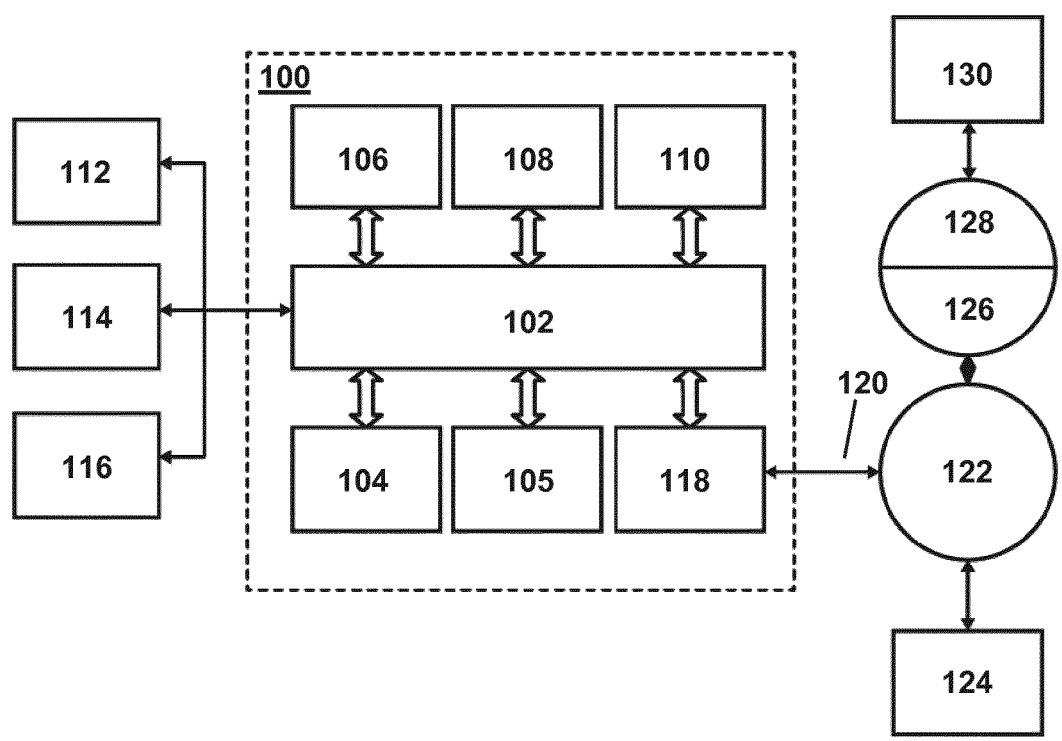
FIG. 10 is a block diagram of an example computer system, according to an embodiment.

FIG. 10 is a block diagram that illustrates a computer system 100 which can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams.

The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 11:
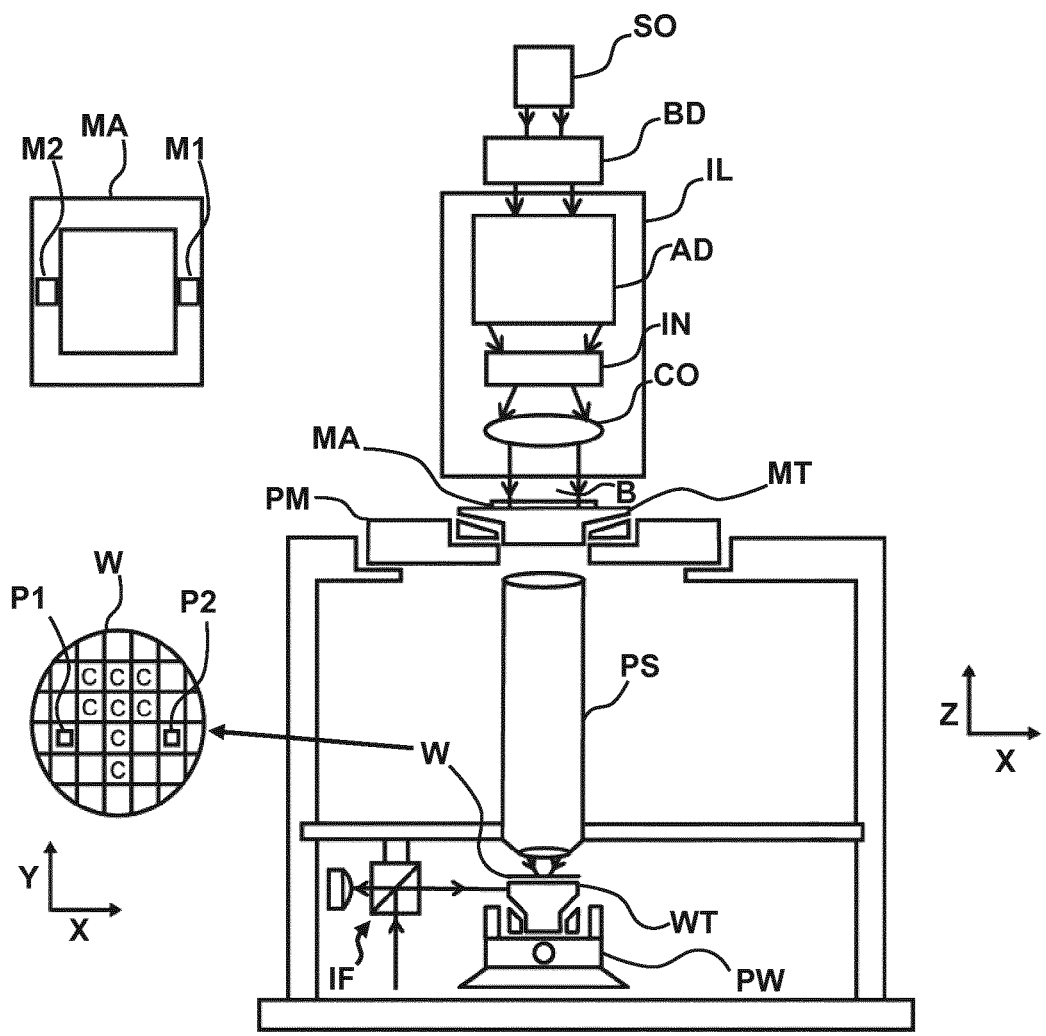
FIG. 11 is a schematic diagram of a lithographic projection apparatus, according to an embodiment.

FIG. 11 schematically depicts an exemplary lithographic projection apparatus that may be utilized in conjunction with the techniques described herein. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device relative to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 11. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 12:
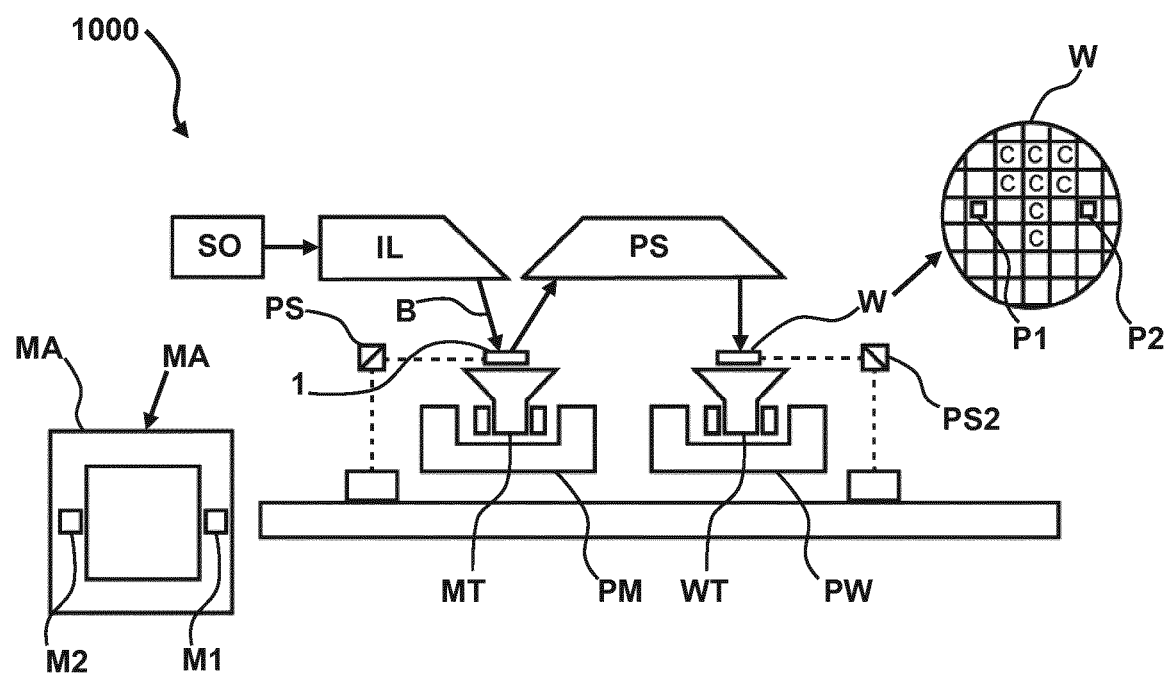
FIG. 12 is a schematic diagram of another lithographic projection apparatus, according to an embodiment.

FIG. 12 schematically depicts another exemplary lithographic projection apparatus 1000 that can be utilized in conjunction with the techniques described herein.

The lithographic projection apparatus 1000 comprises:
- a source collector module SO
- an illumination system (illuminator) IL configured to condition a radiation beam B (e.g. EUV radiation).
- a support structure (e.g. a patterning device table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As depicted in FIG. 12, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 12, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source. In an embodiment, a DUV laser source may be used.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
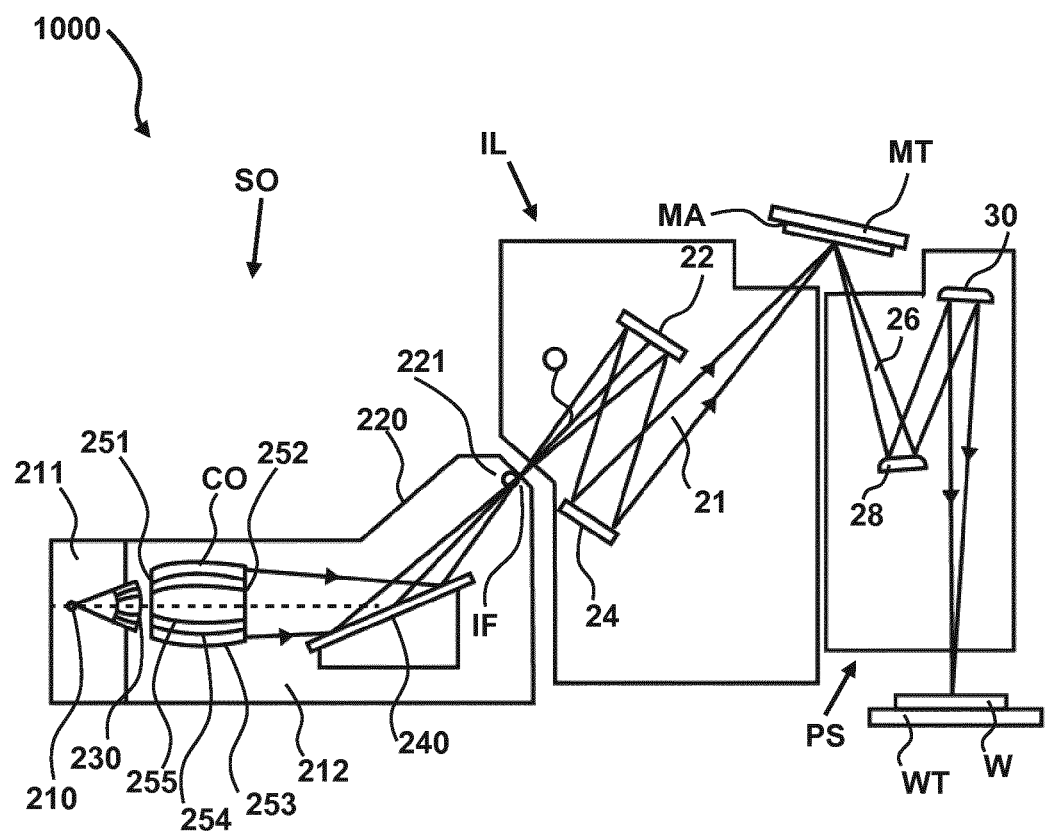
FIG. 13 is a more detailed view of the apparatus in FIG. 10, according to an embodiment.

FIG. 13 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Figure 14:
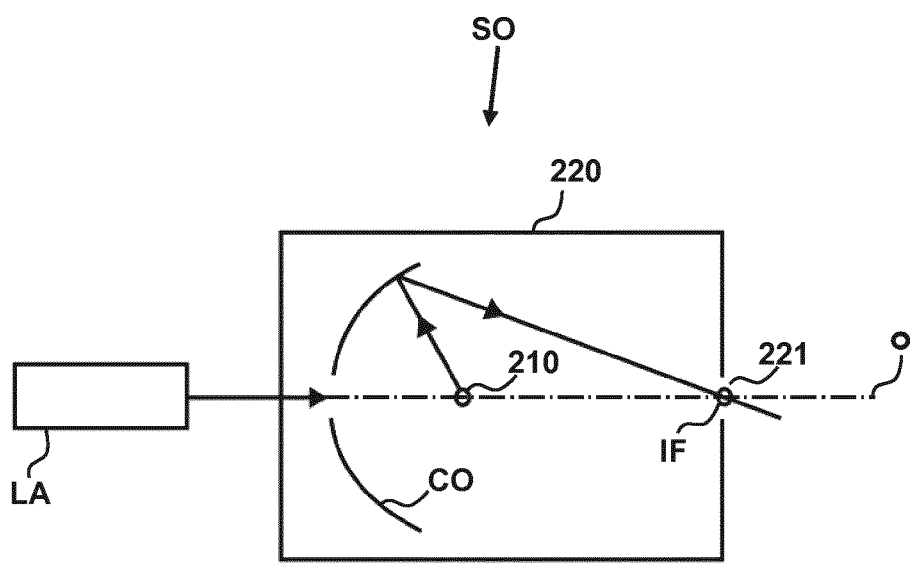
FIG. 14 is a more detailed view of the source collector module SO of the apparatus of FIG. 12 and FIG. 13, according to an embodiment.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Alternatively, the source collector module SO may be part of an LPP radiation system as shown in FIG. 14. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining electromagnetic fields associated with a mask model of a patterning process, the method comprising:
   obtaining, with a hardware computer system, a mask stack region of interest and an interaction order corresponding to the mask stack region of interest, the mask stack region of interest being divided into sub regions, the mask stack region of interest having one or more characteristics associated with propagation of electromagnetic waves through the mask stack region of interest;
   generating, with the hardware computer system, one or more electromagnetic field determination expressions based on the Maxwell Equations and the Quantum Schrodinger Equation; and
   determining, by the hardware computer system, an electromagnetic field associated with the mask stack region of interest based on the sub regions of the mask stack region of interest and the one or more characteristics associated with the propagation of electromagnetic waves through the mask stack region of interest, using the one or more electromagnetic field determination expressions.
2. The method of clause 1, wherein generating the one or more electromagnetic field determination expressions comprises reformulating the Maxwell Equations to correspond to the Quantum Schrodinger Equation such that a directional coordinate of a direction through the mask stack region of interest replaces a time coordinate of the Quantum Schrodinger Equation.
3. The method of any of clauses 1-2, further comprising determining a first characteristic of the one or more characteristics associated with propagation of electromagnetic waves through the mask stack region of interest, the first characteristic being determined based on the sub regions, the first characteristic being associated with propagation of electromagnetic waves through the mask stack region of interest in a first direction.
4. The method of clause 3, wherein the first direction is the "z" direction.
5. The method of any of clauses 3-4, wherein the first characteristic comprises filmstack configuration integrals (I) that correspond to the sub regions.
6. The method of any of clauses 1-5, further comprising determining a second characteristic of the one or more characteristics associated with propagation of electromagnetic waves through the mask stack region of interest, the second characteristic being determined based on the sub regions, the second characteristic being associated with propagation of electromagnetic waves through the mask stack region of interest in second and third directions.
7. The method of clause 6, wherein the second direction is the "x" direction and the third direction is the "y" direction.
8. The method of any of clauses 6-7, wherein the second characteristic comprises elemental propagation matrices (K) that correspond to the sub regions.
9. The method of clause 1, wherein determining the electromagnetic field associated with the mask stack region of interest comprises determining a mask Fourier Transform for the mask stack region of interest.
10. The method of clause 9, wherein the sub regions are slices of the mask stack region of interest.
11. The method of clause 10, wherein the slices are formed along a "z" direction of the mask stack region of interest.
12. The method of any of clauses 10-11, wherein determining the electromagnetic field associated with the mask stack region of interest further comprises determining propagators ($S_i$) for individual slices, the propagators determined based on the mask Fourier Transform and the one or more characteristics associated with propagation of electromagnetic waves through the mask stack region of interest.
13. The method of clause 12, wherein determining the electromagnetic field associated with the mask stack region of interest further comprises determining forward ($P^+$) and backward ($P^-$) propagation projection operators based on the propagators.
14. The method of clause 12, wherein determining the electromagnetic field associated with the mask stack region of interest further comprises aggregating propagators for individual slices to determine a combined propagator (S).
15. The method of clause 1, wherein determining the electromagnetic field associated with the mask stack region of interest further comprises determining a multilayer propagator ($S_0$).
16. The method of clause 15, wherein determining the electromagnetic field associated with the mask stack region of interest further comprises determining Eigen mode projection operators ($P^>$ and $P^<$) based on the multilayer propagator.
17. The method of any of clauses 14 and 16, wherein determining the electromagnetic field associated with the mask stack region of interest further comprises using (i) the propagation projection operators and the combined propagator; or
(ii) the propagation projection operators, the combined propagator, and the Eigen mode projection operators;
to determine a transmission value (T) or a reflection value (R).
18. The method of clause 17, wherein the transmission value is determined for mask stack regions of interest associated with deep ultraviolet systems and the reflection value is determined for mask stack regions of interest associated with extreme ultraviolet systems.
19. The method of any of clauses 17-18, wherein determining the electromagnetic field associated with the mask stack region of interest further comprises applying the transmission value or the reflection value to a modeled electromagnetic wave incident on the mask stack region of interest.
20. The method of any of clauses 1-19, further comprising defining, with the hardware computer system, the mask stack region of interest
21. The method of any of clauses 1-20, further comprising defining, with the hardware computer system, the corresponding interaction order.
22. The method of any of clause 1-21, further comprising, dividing, with the hardware computer system, the mask stack region of interest into sub regions.
23. A computer program product comprising a non-transitory computer readable medium having instructions recorded thereon, the instructions when executed by a computer implementing the method of any of clauses 1-22.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

Mathematical Examples

Image-based M3D calculations may be performed from first principles with no "sampling" procedure and no heuristic parameters, for example.

1. Derivation of Equation of Motion

Consider a continuum comprising a non-magnetic medium with a (complex) dielectric constant $\epsilon(r)$ and permeability $\mu(r) = \mu_0$.

A temporal-harmonic solution may be assumed.

$$E(r,t) = E(r)e^{-i\omega t} \quad (1)$$

$$H(r,t) = H(r)e^{-i\omega t} \quad (2)$$

Then the Maxwell Equations become $$\nabla \times E = i\omega\mu_0 H \quad (3)$$

$$\nabla \times H = -i\omega\epsilon E \quad (4)$$

Treating the z coordinate as a parameter and the EM field at a given z position as a state vector $|\psi, (z)\rangle$, the equation governing the evolution of $|\psi,(z)\rangle$ along z may be found. Since there are 4 degrees of freedom at a given z plane (2 propagation directions times 2 polarization directions), we may choose 4 independent components of the EM field as our representation of the state vector $|\psi,(z)\rangle$.

We choose $$|\psi(z)\rangle \sim \begin{pmatrix} E_x \\ E_y \\ Z_0 H_x \\ Z_0 H_y \end{pmatrix} \quad (6)$$

or more rigorously $$\langle x, y | \psi(z)\rangle = \begin{pmatrix} E_x(x, y, z) \\ E_y(x, y, z) \\ Z_0 H_x(x, y, z) \\ Z_0 H_y(x, y, z) \end{pmatrix} \quad (7)$$

where $Z_0 = \sqrt{\mu_0/\epsilon^0}$ is the wave impedance of a vacuum. The correspondence between this representation and the conventional $|s+\rangle$, $|s-\rangle$, $|p+\rangle$, $|p-\rangle$ representation will be described below.

Rewritten in components, (4) (5) become $$\frac{\partial E_z}{\partial y} - \frac{\partial E_y}{\partial z} = i\omega\mu_0 H_x \quad (8)$$

$$\frac{\partial E_x}{\partial z} - \frac{\partial E_z}{\partial x} = i\omega\mu_0 H_y \quad (9)$$

$$\frac{\partial E_y}{\partial x} - \frac{\partial E_x}{\partial y} = i\omega\mu_0 H_z \quad (10)$$

$$\frac{\partial H_z}{\partial y} - \frac{\partial H_y}{\partial z} = -i\omega\epsilon E_x \quad (11)$$

$$\frac{\partial H_x}{\partial z} - \frac{\partial H_z}{\partial x} = -i\omega\epsilon E_y \quad (12)$$

$$\frac{\partial H_y}{\partial x} - \frac{\partial H_x}{\partial y} = -i\omega\epsilon E_z \quad (13)$$

and the components of $d|\psi(z)\rangle/dz$ can be solved as $$-i\frac{\partial E_x}{\partial z} = \frac{1}{\omega}\frac{\partial}{\partial x}\left(\frac{1}{\epsilon}\frac{\partial H_y}{\partial x}\right) - \frac{1}{\omega}\frac{\partial}{\partial x}\left(\frac{1}{\epsilon}\frac{\partial H_x}{\partial y}\right) + \omega\mu_0 H_y \quad (14)$$

$$-i\frac{\partial E_y}{\partial z} = \frac{1}{\omega}\frac{\partial}{\partial y}\left(\frac{1}{\epsilon}\frac{\partial H_y}{\partial x}\right) - \frac{1}{\omega}\frac{\partial}{\partial y}\left(\frac{1}{\epsilon}\frac{\partial H_x}{\partial y}\right) - \omega\mu_0 H_x \quad (15)$$

$$-i\frac{\partial H_x}{\partial z} = \frac{1}{\omega\mu_0}\frac{\partial^2 E_y}{\partial x^2} + \frac{1}{\omega\mu_0}\frac{\partial^2 E_x}{\partial x \partial y} - \omega\epsilon E_y \quad (16)$$

$$-i\frac{\partial H_y}{\partial z} = -\frac{1}{\omega\mu_0}\frac{\partial^2 E_y}{\partial x \partial y} + \frac{1}{\omega\mu_0}\frac{\partial^2 E_x}{\partial y^2} - \omega\epsilon E_x \quad (17)$$

Written in a compact format, $$\frac{1}{ik_0}\frac{d|\psi\rangle}{dz} = \hat{H}|\psi\rangle \quad (18)$$

Where $$k_0 = \omega\sqrt{\epsilon_0 \mu_0}$$

is the wave number in vacuum, and the "Hamiltonian"

$$\hat{H} = \begin{pmatrix} 0 & 0 & -\frac{1}{k_0^2}\frac{\partial}{\partial x}\left(\frac{1}{\epsilon_r}\frac{\partial}{\partial y}\right) & \frac{1}{k_0^2}\frac{\partial}{\partial x}\left(\frac{1}{\epsilon_r}\frac{\partial}{\partial x}\right)+1 \\ 0 & 0 & -\frac{1}{k_0^2}\frac{\partial}{\partial y}\left(\frac{1}{\epsilon_r}\frac{\partial}{\partial y}\right)-1 & \frac{1}{k_0^2}\frac{\partial}{\partial y}\left(\frac{1}{\epsilon_r}\frac{\partial}{\partial x}\right) \\ \frac{1}{k_0^2}\frac{\partial^2}{\partial x \partial y} & -\frac{1}{k_0^2}\frac{\partial^2}{\partial x_2} - \epsilon_r & 0 & 0 \\ \frac{1}{k_0^2}\frac{\partial^2}{\partial y_2} + \epsilon_r & -\frac{1}{k_0^2}\frac{\partial^2}{\partial x \partial y} & 0 & 0 \end{pmatrix} \quad (19)$$

Note that $\hat{H}$ is not a Hermitian operator. Splitting $\hat{H}$ into two parts, $$\hat{H} = \hat{F} + \hat{G}$$

where $\hat{F}$ is the "Hamiltonian" if there was no medium $\epsilon_r(r) = 1$ $$\hat{F} = \begin{pmatrix} 0 & 0 & -\frac{1}{k_0^2}\frac{\partial^2}{\partial x \partial y} & \frac{1}{k_0^2}\frac{\partial^2}{\partial x_2}+1 \\ 0 & 0 & -\frac{1}{k_0^2}\frac{\partial^2}{\partial y_2}-1 & \frac{1}{k_0^2}\frac{\partial^2}{\partial x \partial y} \\ \frac{1}{k_0^2}\frac{\partial^2}{\partial x \partial y} & -\frac{1}{k_0^2}\frac{\partial^2}{\partial x_2}-1 & 0 & 0 \\ \frac{1}{k_0^2}\frac{\partial^2}{\partial y_2}+1 & -\frac{1}{k_0^2}\frac{\partial^2}{\partial x \partial y} & 0 & 0 \end{pmatrix} \quad (21)$$

and $\hat{G}$ is the residue $$\hat{G} = \frac{1}{k_0^2}\begin{pmatrix} 0 & 0 & \left(1-\frac{1}{\epsilon_r}\right)\frac{\partial^2}{\partial x \partial y} - \frac{\partial\left(\frac{1}{\epsilon_r}\right)}{\partial x}\frac{\partial}{\partial y} & -\left(1-\frac{1}{\epsilon_r}\right)\frac{\partial^2}{\partial x^2} + \frac{\partial\left(\frac{1}{\epsilon_r}\right)}{\partial x}\frac{\partial}{\partial x} \\ 0 & 0 & \left(1-\frac{1}{\epsilon_r}\right)\frac{\partial^2}{\partial y^2} - \frac{\partial\left(\frac{1}{\epsilon_r}\right)}{\partial y}\frac{\partial}{\partial y} & -\left(1-\frac{1}{\epsilon_r}\right)\frac{\partial^2}{\partial x \partial y} + \frac{\partial\left(\frac{1}{\epsilon_r}\right)}{\partial y}\frac{\partial}{\partial x} \\ 0 & -(\epsilon_r-1)k_0^2 & 0 & 0 \\ (\epsilon_r-1)k_0^2 & 0 & 0 & 0 \end{pmatrix} \quad (22)$$

Further split $\hat{G}$ into four parts which are proportional to $(1-1/\epsilon_r)$ $\delta(1-1/\epsilon_r)/\partial_x$ $\delta(1-1/\epsilon_r)/\partial_y$ $(\epsilon_r-1)$ respectively:

$$\hat{G} = \left(1 - \frac{1}{\epsilon_r}\right)\hat{g}_b + \frac{\partial\left(1-\frac{1}{\epsilon_r}\right)}{\partial_x}\hat{g}_x + \frac{\partial\left(1-\frac{1}{\epsilon_r}\right)}{\partial_y}\hat{g}_y + (\epsilon_r - 1)\hat{g}_c \quad (23)$$

where $$\hat{g}_b = \frac{1}{k_0^2}\begin{pmatrix} 0 & 0 & \frac{\partial^2}{\partial x \partial y} & -\frac{\partial^2}{\partial x^2} \\ 0 & 0 & \frac{\partial^2}{\partial y^2} & -\frac{\partial^2}{\partial x \partial y} \\ 0 & 0 & 0 & 0 \\ 0 & 0 & 0 & 0 \end{pmatrix} \quad (24)$$

$$\hat{g}_x = \frac{1}{k_0^2}\begin{pmatrix} 0 & 0 & \frac{\partial}{\partial y} & -\frac{\partial}{\partial x} \\ 0 & 0 & 0 & 0 \\ 0 & 0 & 0 & 0 \\ 0 & 0 & 0 & 0 \end{pmatrix} \quad (25)$$

$$\hat{g}_y = \frac{1}{k_0^2}\begin{pmatrix} 0 & 0 & 0 & 0 \\ 0 & 0 & \frac{\partial}{\partial y} & -\frac{\partial}{\partial x} \\ 0 & 0 & 0 & 0 \\ 0 & 0 & 0 & 0 \end{pmatrix} \quad (26)$$

$$\hat{g}_c = \begin{pmatrix} 0 & 0 & 0 & 0 \\ 0 & 0 & 0 & 0 \\ 0 & -1 & 0 & 0 \\ 1 & 0 & 0 & 0 \end{pmatrix} \quad (27)$$

In summary, the Hamiltonian $\hat{H}$ can be written as the sum of the following terms $$\hat{H} = \hat{F} + \hat{G} \qquad (28)$$

$$= \hat{F} + \left(1 - \frac{1}{\epsilon_r}\right)\hat{g}_b + \frac{\partial(1 - 1/\epsilon_r)}{\partial x}\hat{g}_x + \frac{\partial(1 - 1/\epsilon_r)}{\partial y}\hat{g}_y + (\epsilon_r - 1)\hat{g}_c \qquad (29)$$

Note that the dependency of $\hat{H}$ on $\mathcal{Z}$ completely originates from $$\epsilon_r(r)$$

2. Solving the Equation of Motion

The standard quantum perturbation theory may be used to solve the equation of motion. Assume the boundary condition $$|\psi(\mathcal{Z}=0)\rangle = |\psi_0\rangle$$

Expand $$|\psi(\mathcal{Z})\rangle$$

in series treating $\hat{G}$ as a perturbation $$|\psi(z)\rangle = |\psi^{(0)}(z)\rangle + |\psi^{(1)}(z)\rangle + |\psi^{(2)}(z)\rangle + \ldots \qquad (30)$$

satisfying $$\frac{1}{ik_0}\frac{d|\psi^{(0)}\rangle}{dz} = \hat{F}|\psi^{(0)}\rangle \qquad (31)$$

$$\frac{1}{ik_0}\frac{d|\psi^{(1)}\rangle}{dz} = \hat{F}|\psi^{(1)}\rangle + \hat{G}(z)|\psi^{(0)}\rangle \qquad (32)$$

$$\frac{1}{ik_0}\frac{d|\psi^{(2)}\rangle}{dz} = \hat{F}|\psi^{(2)}\rangle + \hat{G}(z)|\psi^{(1)}\rangle \qquad (33)$$

Since $\hat{F}$ has no dependency on $\mathcal{Z}$, we can determine the zeroth order solution $$|\psi^{(0)}(z)\rangle = e^{ik_0 z \hat{F}}|\psi_0\rangle \qquad (34)$$

Plugging (34) into (32) we get $$\frac{d|\psi^{(1)}(z)\rangle}{d_z} - ik_0\hat{F}|\psi^{(1)}(z)\rangle = ik_0\hat{G}(z)e^{ik_0 z\hat{F}}|\psi_0\rangle \qquad (35)$$

or $$\frac{d}{d_z}\left(e^{-ik_0 z\hat{F}}|\psi^{(1)}(z)\rangle\right) = ik_0 e^{-ik_0 z\hat{F}}\hat{G}(z)e^{ik_0 z\hat{F}}|\psi_0\rangle \qquad (36)$$

Therefore the first order correction is $$|\psi^{(1)}(z)\rangle = ik_0\int_0^z dz' e^{ik_0(z-z')\hat{F}}\hat{G}(z')e^{ik_0 z'\hat{F}}|\psi_0\rangle \qquad (37)$$

Similarly, the second order correction can be solved as $$|\psi^{(2)}(z)\rangle = (ik_0)^2\int_0^z dz'\int_0^{z'} dz'' e^{ik_0(z-z')\hat{F}}\hat{G}(z')e^{ik_0(z'-z'')\hat{F}} \hat{G}(z'')e^{ik_0 z''\hat{F}}|\psi_0\rangle \qquad (38)$$

and the third order correction is $$|\psi^{(3)}(z)\rangle = (ik_0)^3\int_0^z dz'\int_0^{z'} dz''\int_0^{z''} dz''' e^{ik_0(z-z')\hat{F}}\hat{G}(z')e^{ik_0(z'-z'')\hat{F}}\hat{G}(z'')e^{ik_0(z''-z''')\hat{F}}\hat{G}(z''')e^{ik_0 z'''\hat{F}}|\psi_0\rangle \qquad (39)$$

and so on.

Introducing the notation of the propagator $\hat{S}(z, 0)$ $$|\psi(z)\rangle = \hat{S}(z, 0)|\psi(0)\rangle \qquad (40)$$

$$= \left[\hat{S}^{(0)}(z, 0) + \hat{S}^{(1)}(z, 0) + \hat{S}^{(2)}(z, 0) + \ldots\right]|\psi(0)\rangle \qquad (41)$$

We have the following recursive expressions $$\hat{S}^{(n+1)}(z, 0) = ik_0\int_0^z dz' e^{ik_0(z-z')\hat{F}}\hat{G}(z')\hat{S}^{(n)}(z', 0) \qquad (42)$$

While $$\hat{S}^{(0)}(\mathcal{Z}, 0) = e^{ik_0 z\hat{F}} \qquad (43)$$

With the definitions of $\hat{F}$ and $\hat{G}$ in the last section, in principle the solution may be evaluated exactly, although practically speaking, this may seem impossible. However, this is not surprising because so far there is no constraint on the form of $\epsilon_r(r)$.

3. Application to CTM M3D Mask Stacks

Before any calculation for a "CTM M3D" mask, a "CTM M3D" mask must be described. Given a thin mask image m(x, y) and a mask stack configuration $\bar{\epsilon}_r(z)$, assuming the mask image is real-valued and normalized to 0≤m(x, y)≤1, the "CTM M3D" mask is defined using physics.

First consider the situation when m(x, y) is perfectly binarized. In this case, $$\epsilon_r(x,y,z) = 1, \text{ when } m(x,y) = 0 \qquad (44)$$

$$\epsilon_r(x,y,z) = \bar{\epsilon}_r(z), \text{ when } m(x,y) = 1 \qquad (45)$$

The correctness of the following two equations may be verified based on the above definition.

$$\epsilon_r(x, y, z) - 1 = m(x, y)(\bar{\epsilon}_r(z) - 1) \qquad (46)$$

$$1 - \frac{1}{\epsilon_r(x, y, z)} \equiv m(x, y)\left(1 - \frac{1}{\bar{\epsilon}_r(z)}\right) \qquad (47)$$

To simplify notation, define $$h(z) \equiv 1 - \frac{1}{\bar{\epsilon}_r(z)} \qquad (48)$$

and $$l(z) \equiv \bar{\epsilon}_r(z) - 1 \qquad (49)$$

Then the operator $\hat{G}$ in (23) reduces to $$\hat{G}(z) = h(z)\left[m(\hat{x}, \hat{y})\hat{g}_b + \frac{\partial m(\hat{x}, \hat{y})}{\partial \hat{x}}\hat{g}_x + \frac{\partial m(\hat{x}, \hat{y})}{\partial \hat{y}}\hat{g}_y\right] + l(z)m(\hat{x}, \hat{y})\hat{g}_c \qquad (50)$$

In other words, $\hat{G}(z)$ may be linearly constructed with the thin mask image m(x, y) and its gradients $m_x(x, y) = \partial m(x, y)/\partial x$, $m_y(x, y) = \partial m(x, y)/\partial y$ when the thin mask image is perfectly binarized.

Then consider the more generic situation when m(x, y) is not binarized. Since in reality, a thin mask image is always binarized, we only need to find a mathematically rigorous way to extend the above formalism, without the need to strictly consider what it physically means. Thus we adopt (50) as a definition in this case, in order to keep the linearity of $\hat{G}$ w.r.t. m(x, y).

We project the thin mask image m(x, y) onto an arbitrary pre-defined 2D function basis set $\{p_\alpha(x, y)\}$, $$m(x, y) = \sum_\alpha c_\alpha p_\alpha(x, y) \tag{51}$$

Equation (50) becomes $$\hat{G}(z) = \sum_\alpha c_\alpha [h(z)\hat{M}_\alpha + l(z)\hat{N}_\alpha] \tag{52}$$

where $$\hat{M}_\alpha \equiv p_\alpha(\hat{x}, \hat{y})\hat{g}_b + \frac{\partial p_\alpha(\hat{x}, \hat{y})}{\partial \hat{x}}\hat{g}_x + \frac{\partial p_\alpha(\hat{x}, \hat{y})}{\partial \hat{y}}\hat{g}_y \tag{53}$$

$$\hat{N}_\alpha \equiv p_\alpha(\hat{x}, \hat{y})\hat{g}_c \tag{54}$$

Plugging this into (42), we obtain $$\hat{S}^{(n+1)}(z, 0) = ik_0 \sum_\alpha c_\alpha \int_0^z dz' e^{ik_0(z-z')\hat{F}}[h(z')\hat{M}_\alpha + l(z')\hat{N}_\alpha]\hat{S}^{(n)}(z', 0) \tag{55}$$

Therefore $$\hat{S}^{(1)}(z, 0) = \sum_\alpha c_\alpha \hat{R}_\alpha(z, 0) \tag{56}$$

$$\hat{S}^{(2)}(z, 0) = \sum_{\alpha\beta} c_\alpha c_\beta \hat{T}_{\alpha\beta}(z, 0) \tag{57}$$

Where $$\hat{R}_\alpha(z, 0) = ik_0 \int_0^z dz' e^{ik_0(z-z')\hat{F}}[h(z')\hat{M}_\alpha + l(z')\hat{N}_\alpha] e^{ik_0 z'\hat{F}} \tag{58}$$

$$\hat{T}_{\alpha\beta}(z, 0) = \tag{59}$$
$$(ik_0)^2 \int_0^z dz' \int_0^{z'} dz'' e^{ik_0(z-z')\hat{F}}[h(z')\hat{M}_\alpha + l(z')\hat{N}_\alpha] e^{ik_0(z'-z'')\hat{F}}$$
$$[h(z'')\hat{M}_\beta + l(z')\hat{N}_\beta] e^{ik_0 z''\hat{F}}$$

Later we see that if we choose harmonic functions $\{\exp i(k_x x + k_y y)\}$ as a basis $\{P\alpha(x, y)\}$, the $\hat{R}_\alpha(z, 0)$ operator becomes purely multiplicative in k-space, which represents a linear convolution filter in real space. Accordingly, $\hat{T}\alpha\beta$ (z, 0), becomes a bilinear convolution filter, and so on. These operators $\hat{R}_\alpha(z, 0)$, $\hat{T}\alpha\beta$ (z, 0), ... may be calculated prior to knowing the mask pattern, and results can be saved as an "M3D Library".

4. Multiple Etch Steps and Substrate

The substrate can be thought as an etch step with no etching at all. We define the propagator between two arbitrary z-planes as $\hat{S}(z_1, z_0)$:

$$|\psi(z_1)\rangle = \hat{S}(z_1, z_0)|\psi(z_0)\rangle \tag{60}$$

From previous results, by shifting the initial z point from 0 to $z_0$, we have $$\hat{S}(z_1, z_0) = e^{ik_0(z_1-z_0)\hat{F}} + \sum_\alpha c_\alpha \hat{R}_\alpha(z_1, z_0) + \sum_{\alpha\beta} c_\alpha c_\beta \hat{T}_{\alpha\beta}(z_1, z_0) + \ldots \tag{61}$$

When multiple steps are present, we have $$|\psi(z_3)\rangle = \hat{S}(z_3, z_2)|\psi(z_2)\rangle \tag{62}$$

$$= \hat{S}(z_3, z_2)\hat{S}(z_2, z_1)|\psi(z_1)\rangle \tag{63}$$

$$= \hat{S}(z_3, z_2)\hat{S}(z_2, z_1)\hat{S}(z_1, z_0)|\psi(z_0)\rangle \tag{64}$$

therefore $$\hat{S}(z_3, z_0) = \hat{S}(z_3, z_2)\hat{S}(z_2, z_1), \hat{S}(z_1, z_0) \tag{65}$$

i.e. propagators of multiple etch steps can be cascaded.

5. Boundary Conditions for DUV Mask Stacks

A realistic boundary condition for a DUV (trasmitive) mask stack may be: (i) On the incident plane, a forward propagating wave is given (presumably a fully polarized plane wave). (ii) On the outcoming plane, a backward propagating wave is zero. Such a boundary condition is not suitable for the previous formalism. The previous formalism prefers a boundary condition of a fully defined state vector (including forward and backward propagating waves) given at a single z-plane.

In the below we provide an iterative solution to this problem. As a zeroth order approximation, we assume the full state vector at the incident plane is (with no backward propagating wave). As we evolve this state vector to the outcoming plane as $\hat{S}$, it gains both forward and backward components. Define projection operators $\hat{P}^+$ and $\hat{P}^-$ which, when acting on a state vector, extract its forward and backward components (when placed in vacuum) respectively. They satisfy the general properties of projection operators such as $$\hat{P}^+ + \hat{P}^- = 1, \hat{P}^+\hat{P}^- = \hat{P}^-\hat{P}^+ = 0, (\hat{P}^+)^2 = \hat{P}^+, (\hat{P}^-)^2 = \hat{P}^- \tag{66}$$

The backward component $\hat{P}^-\hat{S}$ is certainly non-physical which violates criterion (ii) in the above. Therefore we apply a first-order correction by setting the state vector at the outcoming plane as $\hat{P}^-\hat{S}$, and evolve it back to the incident plane. This cancels the $\hat{P}^-\hat{S}$, but induces another non-physical component $\hat{P}^+\hat{S}^{-1}\hat{S}-|\psi_0\rangle$, which violates (i). Repeating this procedure and in principle we should approach the physical boundary condition.

Now the transmitted wave reads $$\hat{T}|\psi_0\rangle = \hat{P}^+\hat{S}|\psi_0\rangle + \hat{P}^+\hat{S}\hat{P}^+\hat{S}^{-1}\hat{P}^-\hat{S}|\psi_0\rangle + \tag{67}$$
$$\hat{P}^+\hat{S}(\hat{P}^+\hat{S}^{-1}\hat{P}^-\hat{S})^2 + \ldots$$

$$= \hat{P}^+\hat{S}(1 - \hat{P}^+\hat{S}^{-1}\hat{P}^-\hat{S})^{-1}|\psi_0\rangle \tag{68}$$

or the transmission operator is $$\hat{\mathcal{T}} = \hat{P}^+\hat{S}(1 - \hat{P}^+\hat{S}^{-1}\hat{P}^-\hat{S})^{-1} \tag{69}$$

Similarly the reflection operator is $$\hat{\mathcal{R}} = -\hat{P}^-\hat{S}^{-1}\hat{P}^-\hat{S}(1 - \hat{P}^+\hat{S}^{-1}\hat{P}^-\hat{S})^{-1} \tag{70}$$

We can verify that $$\hat{\mathcal{T}} = \hat{S}(1 + \hat{\mathcal{R}}) \tag{71}$$

The derivation of $\hat{P}^+$ and $\hat{P}^-$ will be covered in the final section.

6. Boundary Conditions for EUV Mask Stacks

An EUV (reflective) mask stack consists of two parts: multi-layer reflector and absorber stacks. The multi-layer has periodic structure in z direction and is ideally infinitely thick. We cannot afford to calculate the total propagator of the multi-layer and apply boundary conditions at the bottom as we did for DUV mask. We must treat them separately.

First consider the multi-layer. We can calculate the propagator of a unit cell $\hat{S}_0$. As argued in previous sections, a sequence of n unit cells has a propagator of $(\hat{S}_0)^n$. Assume the state vector at the top of the multi-layer is $|\psi\rangle$. At the bottom of multi-layer, we must have diminishing amplitude. Therefore the physical boundary condition is $$\lim_{n\to\infty} (\hat{S}_0)^n |\psi\rangle = 0 \tag{72}$$

Suppose we diagonalize $\hat{S}_0$ and find all its Eigen values and Eigen vectors. Let $\hat{P}^>$ be the projection operator which projects a vector onto the vector space formed by all the eigen vectors of $\hat{S}_0$ whose eigen values have magnitude larger than 1, and $\hat{P}^<$ be the projection operator which projects a vector onto the vector space formed by all the eigen vectors of $\hat{S}_0$ whose eigen values have magnitude smaller than 1. The previous boundary condition (72) thus translates to $$\hat{P}^>|\psi\rangle = 0 \tag{73}$$

Compared with the DUV mask boundary condition $\hat{P}^-|\psi\rangle = 0$, they are almost the same form. Following the same iterative strategy as DUV case, we can write down the solution to the reflection operator as $$\hat{R} = -\hat{P}^- \hat{S}^{-1} \hat{P}^> \hat{S}(1 - \hat{P}^+ \hat{S}^{-1} \hat{P}^> \hat{S})^{-1}$$

where $\hat{S}$ is the propagator for the absorber layer and $\hat{P}^+$, $\hat{P}^-$, have the same definition as in the DUV case. It can be verified that $$\lim_{n\to\infty} (\hat{S}_0)^n \hat{S}(1 + \hat{R}) = 0 \tag{75}$$

The derivation of $\hat{P}^>$ and $\hat{P}^<$ will be covered in the final section.

7. Simplification Using Harmonic Expansion for Mask

Derivations in previous sections are generic and algebraic. In principle, one can select any representation for the expansion of mask image $m(x, y)$ and state vector $|\psi\rangle$. We show in this section, however, if harmonic functions are chosen, computation becomes much simpler.

7.1 the Free-Space Propagator $$e^{ik_0 z \hat{F}}$$

According to (21), the matrix element of $\hat{F}$ between two harmonic states is $$\langle k'_x, k'_y | \hat{F} | k_x, k_y \rangle = \delta(k_x - k'_x)\delta(k_y - k'_y) F(k_x, k_y) \tag{76}$$

where $F(k_x, k_y)$ denotes a 4×4 matrix $$F(k_x, k_y) = \frac{1}{k_0^2}\begin{pmatrix} 0 & 0 & k_x k_y & -k_x^2 + k_0^2 \\ 0 & 0 & k_y^2 - k_0^2 & -k_x k_y \\ -k_x k_y & k_x^2 - k_0^2 & 0 & 0 \\ -k_y^2 + k_0^2 & k_x k_y & 0 & 0 \end{pmatrix} \tag{77}$$

Hence $$\langle k'_x, k'_y | e^{ik_0 z \hat{F}} | k_x, k_y \rangle = \delta(k_x - k'_x)\delta(k_y - k'_y) e^{ik_0 z F(k_x, k_y)} \tag{78}$$

Using the definition of Pauli matrices:

$$\sigma_x = \begin{pmatrix} 0 & 1 \\ 1 & 0 \end{pmatrix}, \sigma_y = \begin{pmatrix} 0 & -i \\ i & 0 \end{pmatrix}, \sigma_z = \begin{pmatrix} 1 & 0 \\ 0 & -1 \end{pmatrix} \tag{79}$$

$F(k_x, k_y)$ breaks down to $$F(k_x, k_y) = \sigma_y \otimes \left[ -\left(1 - \frac{k_x^2 + k_y^2}{2k_0^2}\right)\sigma_y + \frac{i(k_y^2 - k_x^2)}{2k_0^2}\sigma_x + \frac{ik_x k_y}{k_0^2}\sigma_z \right] \tag{80}$$

$$= \frac{\sqrt{k_0^2 - k_x^2 - k_y^2}}{k_0} \sigma_y \otimes (\sigma \cdot n(k_x, k_y)) \tag{81}$$

where $|n(k_x, k_y)| = 1$ is a unit vector and $\otimes$ denotes a Kronecker direct product. Using a Taylor expansion, we can prove the following equality $$e^{i\lambda \sigma_y \otimes (n \cdot \sigma)} = \cos\lambda + i\sigma_y \otimes (n \cdot \sigma)\sin\lambda \tag{82}$$

Therefore $$e^{ik_0 z F(k_x, k_y)} = \tag{83}$$

$$\cos\left(\sqrt{k_0^2 - k_x^2 - k_y^2}\, z\right) + i\frac{k_0}{\sqrt{k_0^2 - k_x^2 - k_y^2}}\sin\left(\sqrt{k_0^2 - k_x^2 - k_y^2}\, z\right) F(k_x, k_y)$$

Defining $$k_z(k_x, k_y) \equiv \sqrt{k_0^2 - k_x^2 - k_y^2} \tag{84}$$

we get $$e^{ik_0 z F(k_x, k_y)} = \cos k_z z + i\frac{k_0}{k_z}\sin k_z z \cdot F(k_x, k_y) \tag{85}$$

7.2 Operators $\hat{M}_\alpha$ and $\hat{N}_\alpha$

According to (24)-(27), operators $\hat{g}_b$, $\hat{g}_x$, $\hat{g}_y$ and $\hat{g}_c$ are also diagonal in k-space $$\langle k'_x, k'_y | \hat{g}_b | k_x, k_y \rangle = \delta(k_x - k'_x)\delta(k_y - k'_y) g_b(k_x, k_y) \tag{86}$$

$$\langle k'_x, k'_y | \hat{g}_x | k_x, k_y \rangle = \delta(k_x - k'_x)\delta(k_y - k'_y) g_x(k_x, k_y) \tag{87}$$

$$\langle k'_x, k'_y | \hat{g}_y | k_x, k_y \rangle = \delta(k_x - k'_x)\delta(k_y - k'_y) g_y(k_x, k_y) \tag{88}$$

$$\langle k'_x, k'_y | \hat{g}_c | k_x, k_y \rangle = \delta(k_x - k'_x)\delta(k_y - k'_y) g_c \tag{89}$$

where $$g_b(k_x, k_y) = \frac{1}{k_0^2}\begin{pmatrix} 0 & 0 & -k_x k_y & k_x^2 \\ 0 & 0 & -k_y^2 & k_x k_y \\ 0 & 0 & 0 & 0 \\ 0 & 0 & 0 & 0 \end{pmatrix} \tag{90}$$

$$g_x(k_x, k_y) = \frac{1}{k_0^2}\begin{pmatrix} 0 & 0 & ik_y & -ik_x \\ 0 & 0 & 0 & 0 \\ 0 & 0 & 0 & 0 \\ 0 & 0 & 0 & 0 \end{pmatrix} \tag{91}$$

-continued $$g_x(k_x, k_y) = \frac{1}{k_0^2}\begin{pmatrix} 0 & 0 & 0 & 0 \\ 0 & 0 & ik_y & -ik_x \\ 0 & 0 & 0 & 0 \\ 0 & 0 & 0 & 0 \end{pmatrix}$$ (92)

$$g_c = \begin{pmatrix} 0 & 0 & 0 & 0 \\ 0 & 0 & 0 & 0 \\ 0 & -1 & 0 & 0 \\ 1 & 0 & 0 & 0 \end{pmatrix}$$ (93)

Expanding m(x,y) in harmonic bases $$m(x, y) = \sum_{\alpha\beta} c_{\alpha\beta} e^{i(\alpha x + \beta y)}$$ (94)

We have $$\langle k'_x, k'_y | e^{i(\alpha \hat{x} + \beta \hat{y})} | k_x, k_y \rangle = \delta(k_x + \alpha - k'_x)\delta(k_y + \beta - k'_y)$$ (95)

Therefore $$\langle k'_x, k'_y | \hat{M}_{\alpha\beta} | k_x, k_y \rangle = \langle k'_x, k'_y | [e^{i(\alpha \hat{x} + \beta \hat{y})} \hat{g}_b + i\alpha e^{i(\alpha \hat{x} + \beta \hat{y})} \hat{g}_x +$$ (96)

$$i\beta e^{i(\alpha \hat{x} + \beta \hat{y})} \hat{g}_y ] | k_x, k_y \rangle$$

$$= \delta(k_x + \alpha - k'_x)\delta(k_y + \beta - k'_y) g(k'_x, k'_y; k_x, k_y)$$ (97)

where the definition of $$g(k'_x, k'_y; k_x, k_y)$$ is $$g(k'_x, k'_y; k_x, k_y) \equiv [g_b(k_x, k_y) + i(k'_x - k_x)g_x(k_x, k_y) +$$ (98)

$$i(k'_y - k_y)g_y(k_x, k_y)]$$

$$= \frac{1}{k_0^2}\begin{pmatrix} 0 & 0 & -k'_x k_y & k'_x k_x \\ 0 & 0 & -k'_y k_y & k'_y k_x \\ 0 & 0 & 0 & 0 \\ 0 & 0 & 0 & 0 \end{pmatrix}$$ (99)

Similarly $$\langle k'_x, k'_y | \hat{N}_{\alpha\beta} | k_x, k_y \rangle = \delta(k_x + \alpha - k'_x)\delta(k_y + \beta - k'_y) g_c$$ (100)

7.3 the Total Propagator $\hat{S}(z, 0)$

From (58), $$\langle k'_x, k'_y | \hat{R}_{\alpha\beta}(z, 0) | k_x, k_y \rangle = \langle k'_x, k'_y | ik_0 \int_0^z dz' e^{ik_0(z-z')F}[h(z')\hat{M}_{\alpha\beta} + l(z')\hat{N}_{\alpha\beta}]e^{ik_0 z' F} | k_x, k_y \rangle$$ (101)

Note that $\hat{F}$ does not change $k_x$ and $k_y$, $\hat{M}_{\alpha\beta}$ and $\hat{N}_{\alpha\beta}$ change $k_x$ by exactly $\alpha$ and $k_y$ by exactly $\beta$. Therefore $$\langle k'_x, k'_y | \hat{R}_{\alpha\beta}(z, 0) | k_x, k_y \rangle = \delta(k_x + \alpha - k'_x)\delta(k_y + \beta - k'_y) \cdot ik_0$$ (102)

$$\int_0^z dz' \left[\cos k'_z(z-z') + i\frac{k_0}{k'_z}\sin k'_z(z-z') \cdot F(k'_x, k'_y)\right] \cdot$$

$$[h(z')g(k_x + \alpha, k_y + \beta; k_x, k_y) + l(z')g_c] \cdot$$

$$\left[\cos k_z z' + i\frac{k_0}{k_z}\sin k_z z' \cdot F(k_x, k_y)\right]$$

Similarly we can work out $\hat{T}_{\alpha\beta\gamma\delta}, \ldots$ and the total propagator can be summarized in the following format $$\langle k'_x, k'_y | \hat{S}(z, 0) | k_x, k_y \rangle = \sum_{n=0}^{\infty} \sum_{[k' \ldots k]_{n+1}} c \ldots c_{[k' \ldots k]_{n+1}}$$ (103)

$$\sum_{[bF]_{n+1}} \sum_{[bG]_n} I_{[bF]_{n+1}}^{[bG]_n}([k' \ldots k]_{n+1}, z, 0) K_{[bF]_{n+1}}^{[bG]_n}([k' \ldots k]_{n+1})$$

Some explanations for the above notation:

$$[k' \ldots k]_{n+1}$$

denotes an (n+1)-array of 2D k vectors with the first element being k' and the last element being k Summation is over all possible arrays.

$$c \ldots c_{[k' \ldots k]_{n+1}}$$

denotes products of c coefficients with their subscripts compatible with the increments of the array $[k' \ldots k]_{n+1}$.
When n=0, it denotes a constant 1.

$$[bF]_{n+1}$$

denotes an (n+1)-array of binary digits 0/1. This pattern determines whether to take the cos term (digit 0) or the sin term (digit 1) in the bracket of (102). Summation is over all possible patterns.

$$[bG]_n$$

denotes an n-array of binary digits 0/1. When n=0 it denotes an empty array. This pattern determines whether to take the h term (digit 0) or the l term (digit 1) in the bracket of (102). Summation is over all possible patterns.

$$I_{[bF]_{n+1}}^{[bG]_n}([k' \ldots k]_{n+1}, Z, 0)$$

are scalar integrals.

Each 0/1 in $[bF]_{n+1}$ denotes a cos/sin factor, and each 0/1 in $[bG]n$ denotes a h/l factor. For example, $$c \ldots c_{[k', k_1, k]} = c_{k'-k_1} c_{k_1-k}$$ (104)

$$I_{011}^{01}([k', k_1, k], z, 0) =$$ (105)

$$(ik_0)^2 \int_0^z dz' \int_0^{z'} dz'' \cos[k_z(k') \cdot (z-z')] h(z') \cdot \frac{ik_0 \sin[k_z(k_1) \cdot (z'-z'')]}{k_z(k_1)}$$

$$l(z'') \frac{ik_0 \sin k_z(k) z''}{k_z(k)}$$

A complete recursive definition for $$I_{[bF]_{n+1}}^{[bG]_n}([k' \ldots k]_{n+1}, z, 0)$$

is $$I_{[0\ldots]_{n+1}}^{[0\ldots]_n}([k \ldots]_{n+1}, z, 0) = \quad (106)$$

$$ik_0 \int_0^z \cos[k_z(k)(z-z')]h(z')I_{[\ldots]_n}^{[\ldots]_{n-1}}([\ldots]_n, z', 0)dz'$$

$$I_{[1\ldots]_{n+1}}^{[0\ldots]_n}([k \ldots]_{n+1}, z, 0) = \quad (107)$$

$$ik_0 \int_0^z \frac{ik_0 \sin[k_z(k)(z-z')]}{k_z(k)} h(z')I_{[\ldots]_n}^{[\ldots]_{n-1}}([\ldots]_n, z', 0)dz'$$

$$I_{[0\ldots]_{n+1}}^{[1\ldots]_n}([k \ldots]_{n+1}, z, 0) = \quad (108)$$

$$ik_0 \int_0^z \cos[k_z(k)(z-z')]l(z')I_{[\ldots]_n}^{[\ldots]_{n-1}}([\ldots]_n, z', 0)dz'$$

$$I_{[1\ldots]_{n+1}}^{[1\ldots]_n}([k \ldots]_{n+1}, z, 0) = \quad (109)$$

$$ik_0 \int_0^z \frac{ik_0 \sin[k_z(k)(z-z')]}{k_z(k)} l(z')I_{[\ldots]_n}^{[\ldots]_{n-1}}([\ldots]_n, z', 0)dz'$$

while $$I_{[0]}^{[\,]}([k], z, 0) = \cos[k_z(k)(z-0)] \quad (110)$$

$$I_{[1]}^{[\,]}([k], z, 0) = \frac{ik_0 \sin[k_z(k)(z-0)]}{k_z(k)} \quad (111)$$

$$K_{[bF]_{n+1}}^{[bG]_n}([k' \ldots k]_{n+1})$$

are 4×4 matrices. Each 0/1 in $[bF]_{n+1}$ denotes a unit matrix (nothing)/F factor, and each 0/1 in $[bG]_n$ denotes a $g/g_c$ factor. For example, $$K_{011}^{01}([k',k_1,k]) = g(k\zeta;k_1)F(k_1)g_cF(k) \quad (112)$$

A complete recursive definition for $$K_{[bF]_{n+1}}^{[bG]_n}([k' \ldots k]_{n+1})$$

is $$K_{[0\ldots]_{n+1}}^{[0\ldots]_n}([kk_1 \ldots]_{n+1}) = g(k;k_1)K_{[\ldots]_n}^{[\ldots]_{n-1}}([k_1 \ldots]_n) \quad (113)$$

$$K_{[1\ldots]_{n+1}}^{[0\ldots]_n}([kk_1 \ldots]_{n+1}) = F(k)g(k;k_1)K_{[\ldots]_n}^{[\ldots]_{n-1}}([k_1 \ldots]_n) \quad (114)$$

$$K_{[0\ldots]_{n+1}}^{[1\ldots]_n}([kk_1 \ldots]_{n+1}) = g_c K_{[\ldots]_n}^{[\ldots]_{n-1}}([k_1 \ldots]_n) \quad (115)$$

$$K_{[1\ldots]_{n+1}}^{[1\ldots]_n}([kk_1 \ldots]_{n+1}) = F(k)g_c K_{[\ldots]_n}^{[\ldots]_{n-1}}([k_1 \ldots]_n) \quad (116)$$

while $$I_{[0]}^{[\,]}([k]) = 1 \quad (117)$$

$$I_{[1]}^{[\,]}([k]) = F(k) \quad (118)$$

7.4 The Projection Operators
7.4.1 The $\hat{P}^+$ and $\hat{P}^-$ Operators

Now we derive expressions for $\hat{P}^+$ and $\hat{P}^-$. Using harmonic functions $$\{e^{i(k_x x + k_y y)}\}$$

as representation for $|\psi\rangle$, the $\hat{F}$ operator becomes $$\langle k'_x, k'_y | \hat{F} | k_x, k_y \rangle = \quad (119)$$

$$\frac{\delta(k_x - k'_x)\delta(k_y - k'_y)}{k_0^2} \begin{pmatrix} 0 & 0 & k_x k_y & -k_x^2 + k_0^2 \\ 0 & 0 & k_y^2 - k_0^2 & -k_x k_y \\ -k_x k_y & k_x^2 - k_0^2 & 0 & 0 \\ -k_y^2 + k_0^2 & k_x k_y & 0 & 0 \end{pmatrix}$$

Its four Eigen values are $$\pm \sqrt{k_0^2 - k_x^2 - k_y^2}/k_0$$

and the corresponding Eigen vectors are $$|s+\rangle = \begin{pmatrix} -\frac{k_y}{\sqrt{k_0^2 - k_x^2 - k_y^2}} \\ \frac{k_x}{\sqrt{k_0^2 - k_x^2 - k_y^2}} \\ \frac{k_x}{k_0} \\ \frac{k_y}{k_0} \end{pmatrix}, \quad |p+\rangle = \begin{pmatrix} \frac{k_x}{k_0} \\ \frac{k_y}{k_0} \\ \frac{k_y}{\sqrt{k_0^2 - k_x^2 - k_y^2}} \\ -\frac{k_x}{\sqrt{k_0^2 - k_x^2 - k_y^2}} \end{pmatrix} \quad (120)$$

$$|s-\rangle = \begin{pmatrix} -\frac{k_y}{\sqrt{k_0^2 - k_x^2 - k_y^2}} \\ \frac{k_x}{\sqrt{k_0^2 - k_x^2 - k_y^2}} \\ \frac{k_x}{k_0} \\ \frac{k_y}{k_0} \end{pmatrix}, \quad |p-\rangle = \begin{pmatrix} \frac{k_x}{k_0} \\ \frac{k_y}{k_0} \\ \frac{k_y}{\sqrt{k_0^2 - k_x^2 - k_y^2}} \\ -\frac{k_x}{\sqrt{k_0^2 - k_x^2 - k_y^2}} \end{pmatrix} \quad (121)$$

Here we use $\sqrt{\phantom{-}}$ to denote the positive root (if real) or the root with positive imaginary part (if imaginary). The corresponding conjugate vectors are $$\langle s+| = \frac{1}{2(k_x^2 + k_y^2)}\left(k_y\sqrt{k_0^2 - k_x^2 - k_y^2}, -k_x\sqrt{k_0^2 - k_x^2 - k_y^2}, k_x k_0, k_y k_0\right) \quad (122)$$

$$\langle p+| = \frac{1}{2(k_x^2 + k_y^2)}\left(k_x k_0, k_y k_0, -k_y\sqrt{k_0^2 - k_x^2 - k_y^2}, k_x\sqrt{k_0^2 - k_x^2 - k_y^2}\right) \quad (123)$$

$$\langle s-| = \frac{1}{2(k_x^2 + k_y^2)}\left(-k_y\sqrt{k_0^2 - k_x^2 - k_y^2}, k_x\sqrt{k_0^2 - k_x^2 - k_y^2}, k_x k_0, k_y k_0\right) \quad (124)$$

$$\langle p-| = \frac{1}{2(k_x^2 + k_y^2)}\left(k_x k_0, k_y k_0, k_y\sqrt{k_0^2 - k_x^2 - k_y^2}, -k_x\sqrt{k_0^2 - k_x^2 - k_y^2}\right) \quad (125)$$

The projection operators thus can be constructed as $$\langle k'_x, k'_y | \hat{P}^+ | k_x, k_y \rangle = \delta(k_x - k'_x)\delta(k_y - k'_y)(|s+\rangle\langle s+| + |p+\rangle\langle p+|) \quad (126)$$

$$= \delta(k_x - k'_x)\delta(k_y - k'_y) \cdot \quad (127)$$

-continued $$\frac{1}{2}\begin{pmatrix} 1 & 0 & \frac{k_x k_y}{k_0\sqrt{k_0^2-k_x^2-k_y^2}} & \frac{k_0^2-k_x^2}{k_0\sqrt{k_0^2-k_x^2-k_y^2}} \\ 0 & 1 & -\frac{k_0^2-k_y^2}{k_0\sqrt{k_0^2-k_x^2-k_y^2}} & -\frac{k_x k_y}{k_0\sqrt{k_0^2-k_x^2-k_y^2}} \\ -\frac{k_x k_y}{k_0\sqrt{k_0^2-k_x^2-k_y^2}} & -\frac{k_0^2-k_x^2}{k_0\sqrt{k_0^2-k_x^2-k_y^2}} & 1 & 0 \\ \frac{k_0^2-k_y^2}{k_0\sqrt{k_0^2-k_x^2-k_y^2}} & \frac{k_x k_y}{k_0\sqrt{k_0^2-k_x^2-k_y^2}} & 0 & 1 \end{pmatrix}$$

$$\langle k_x', k_y'|\hat{P}^-|k_x, k_y\rangle = \delta(k_x-k_x')\delta(k_y-k_y')(|s-\rangle\langle s-|+|p-\rangle\langle p-|) \quad (128)$$

$$= \delta(k_x-k_x')\delta(k_y-k_y') \cdot \quad (129)$$

$$\frac{1}{2}\begin{pmatrix} 1 & 0 & -\frac{k_x k_y}{k_0\sqrt{k_0^2-k_x^2-k_y^2}} & -\frac{k_0^2-k_x^2}{k_0\sqrt{k_0^2-k_x^2-k_y^2}} \\ 0 & 1 & \frac{k_0^2-k_y^2}{k_0\sqrt{k_0^2-k_x^2-k_y^2}} & \frac{k_x k_y}{k_0\sqrt{k_0^2-k_x^2-k_y^2}} \\ \frac{k_x k_y}{k_0\sqrt{k_0^2-k_x^2-k_y^2}} & \frac{k_0^2-k_x^2}{k_0\sqrt{k_0^2-k_x^2-k_y^2}} & 1 & 0 \\ -\frac{k_0^2-k_y^2}{k_0\sqrt{k_0^2-k_x^2-k_y^2}} & -\frac{k_x k_y}{k_0\sqrt{k_0^2-k_x^2-k_y^2}} & 0 & 1 \end{pmatrix}$$

7.4.2 The $\hat{P}^>$ and $\hat{P}^<$ Operators

These two operators depend on the propagator $\hat{S}_0$, which involves information of the multi-layer filmstack. Thus we cannot provide a universal expression for $\hat{P}^>$ and $\hat{P}^<$ here. However, the multi-layer is never etched and is thus translationally invariant in the xy-plane. The in-plane wave vector $k_x$ and $k_y$ are thus conserved numbers. In general, $\hat{S}_0$ can be written in the format $$\langle k_x',k_y'|\hat{S}_0|k_x,k_y\rangle = \delta(k_x-k_x')\delta(k_y-k_y')S_0 \quad (130)$$

where $S_0$ is a 4×4 matrix. Its four Eigen vectors are $\{|v_i\rangle\}$, i=1, 2, 3, 4 and Eigen values are $\{e_i\}$, i=1, 2, 3, 4. Then $$\langle k_x', k_y'|\hat{P}^<|k_x, k_y\rangle = \delta(k_x-k_x')\delta(k_y-k_y')\sum_{\|e_i\|<1}|v_i\rangle\langle v_i| \quad (131)$$

$$\langle k_x', k_y'|\hat{P}^>|k_x, k_y\rangle = \delta(k_x-k_x')\delta(k_y-k_y')\sum_{\|e_i\|\geq 1}|v_i\rangle\langle v_i| \quad (132)$$

Similar to how $\hat{P}^+$ and $\hat{P}^-$ were constructed.

What is claimed is:

1. A method for determining electromagnetic fields associated with a mask model of a patterning process, the method comprising:
   obtaining, with a hardware computer system, a mask stack region of interest, the mask stack region of interest being divided into sub regions, the mask stack region of interest having one or more characteristics associated with propagation of electromagnetic waves through the mask stack region of interest;
   generating, with the hardware computer system, one or more electromagnetic field determination expressions based on the Maxwell Equations and the Quantum Schrodinger Equation; and
   determining, by the hardware computer system, an electromagnetic field associated with the mask stack region of interest based on the sub regions of the mask stack region of interest and the one or more characteristics associated with the propagation of electromagnetic waves through the mask stack region of interest, using the one or more electromagnetic field determination expressions.

2. The method of claim 1, wherein generating the one or more electromagnetic field determination expressions comprises reformulating the Maxwell Equations to correspond to the Quantum Schrodinger Equation such that a directional coordinate of a direction through the mask stack region of interest replaces a time coordinate of the Quantum Schrodinger Equation.

3. The method of claim 1, further comprising determining a first characteristic of the one or more characteristics associated with propagation of electromagnetic waves through the mask stack region of interest, the first characteristic being determined based on the sub regions, the first characteristic being associated with propagation of electromagnetic waves through the mask stack region of interest in a first direction.

4. The method of claim 1, further comprising determining a second characteristic of the one or more characteristics associated with propagation of electromagnetic waves through the mask stack region of interest, the second characteristic being determined based on the sub regions, the second characteristic being associated with propagation of electromagnetic waves through the mask stack region of interest in second and third directions.

5. A computer program product comprising a non-transitory computer readable medium having instructions therein, the instructions, when executed by a computer system, configured to cause the computer system to at least:
   obtain a mask stack region of interest, the mask stack region of interest being divided into sub regions, the mask stack region of interest having one or more characteristics associated with propagation of electromagnetic waves through the mask stack region of interest; and
   determine an electromagnetic field associated with the mask stack region of interest, based on the sub regions of the mask stack region of interest and the one or more characteristics associated with the propagation of electromagnetic waves through the mask stack region of interest, using one or more electromagnetic field determination expressions based on the Maxwell Equations and the Quantum Schrodinger Equation.

6. The computer program product of claim 5, wherein the instructions configured to cause the computer system to generate the one or more electromagnetic field determination expressions are further configured to cause the computer system to determine a solution of reformulated Maxwell Equations, wherein the reformulated Maxwell Equations are configured such that a directional coordinate of a direction through the mask stack region of interest replaces a time coordinate of the Quantum Schrodinger Equation.

7. The computer program product of claim 5, wherein the instructions configured to cause the computer system to determine the electromagnetic field associated with the mask stack region of interest are further configured to cause the computer system to determine a mask Fourier Transform for the mask stack region of interest.

8. The computer program product of claim 7, wherein the instructions configured to cause the computer system to determine the electromagnetic field associated with the mask stack region of interest are further configured to cause the computer system to determine propagators for individual sub regions, the propagators determined based on the mask Fourier Transform and the one or more characteristics associated with propagation of electromagnetic waves through the mask stack region of interest.

9. The computer program product of claim 8, wherein the instructions configured to cause the computer system to determine the electromagnetic field associated with the mask stack region of interest are further configured to cause the computer system to determine forward and backward propagation projection operators based on the propagators.

10. The computer program product of claim 8, wherein the instructions configured to cause the computer system to determine the electromagnetic field associated with the mask stack region of interest are further configured to cause the computer system to aggregate propagators for individual sub regions to determine a combined propagator.

11. The computer program product of claim 10, wherein the instructions configured to cause the computer system to determine the electromagnetic field associated with the mask stack region of interest are further configured to cause the computer system to use the propagation projection operators and the combined propagator to determine a transmission value or a reflection value.

12. The computer program product of claim 11, wherein the instructions configured to cause the computer system to determine the electromagnetic field associated with the mask stack region of interest are further configured to cause the computer system to apply the transmission value or the reflection value to a modeled electromagnetic wave incident on the mask stack region of interest.

13. The computer program product of claim 5, wherein the instructions are further configured to cause the computer system to determine a first characteristic of the one or more characteristics associated with propagation of electromagnetic waves through the mask stack region of interest, the first characteristic being determined based on the sub regions, the first characteristic being associated with propagation of electromagnetic waves through the mask stack region of interest in a first direction.

14. The computer program product of claim 13, wherein the first direction is the "z" direction, and/or
wherein the first characteristic comprises filmstack configuration integrals that correspond to the sub regions.

15. The computer program product of claim 5, wherein the instructions are further configured to cause the computer system to determine a second characteristic of the one or more characteristics associated with propagation of electromagnetic waves through the mask stack region of interest, the second characteristic being determined based on the sub regions, the second characteristic being associated with propagation of electromagnetic waves through the mask stack region of interest in second and third directions.

16. The computer program product of claim 15, wherein the second direction is the "x" direction and the third direction is the "y" direction, and/or
wherein the second characteristic comprises elemental propagation matrices that correspond to the sub regions.

17. The computer program product of claim 5, wherein the instructions configured to cause the computer system to determine the electromagnetic field associated with the mask stack region of interest are further configured to cause the computer system to determine a multilayer propagator.

18. The computer program product of claim 17, wherein the instructions configured to cause the computer system to determine the electromagnetic field associated with the mask stack region of interest are further configured to cause the computer system to determine Eigen mode projection operators based on the multilayer propagator.

19. The computer program product of claim 5, wherein the instructions are further configured to cause the computer system to define a corresponding interaction order, and divide the mask stack region of interest into sub regions.

20. The computer program product of claim 5, wherein the instructions are further configured to cause the computer system to obtain filmstack configuration integrals or elemental propagation matrices prestored in a library.

* * * * *